US 012439786B2

(12) United States Patent
An et al.

(10) Patent No.: US 12,439,786 B2
(45) Date of Patent: *Oct. 7, 2025

(54) DISPLAY DEVICE

(71) Applicant: Samsung Display Co., Ltd., Yongin-si (KR)

(72) Inventors: Jun-yong An, Anyang-si (KR); Jaewon Kim, Cheongju-si (KR); Hyunae Park, Hwaseong-si (KR); Hyungjun Park, Seongnam-si (KR); Seungwoo Sung, Cheonan-si (KR); Young-soo Yoon, Seoul (KR); Ji-eun Lee, Seoul (KR); Yun-kyeong In, Hwaseong-si (KR); Donghyeon Jang, Suwon-si (KR); Junyoung Jo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/220,273

(22) Filed: Jul. 11, 2023

(65) Prior Publication Data
US 2023/0351965 A1 Nov. 2, 2023

Related U.S. Application Data

(63) Continuation of application No. 17/897,202, filed on Aug. 28, 2022, now Pat. No. 11,727,879, which is a
(Continued)

(30) Foreign Application Priority Data
Nov. 30, 2018 (KR) .................. 10-2018-0152681

(51) Int. Cl.
G09G 5/00 (2006.01)
G09G 3/3233 (2016.01)
(Continued)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC .. H10K 59/1315; H10K 50/841; H10K 59/40; H10K 59/65; H10K 59/1213;
(Continued)

(56) References Cited

U.S. PATENT DOCUMENTS 6,933,916 B2 8/2005 Nakao et al.
9,632,487 B2 4/2017 Kim et al.
(Continued)

FOREIGN PATENT DOCUMENTS

CN 107039493 A 8/2017
CN 107275336 A 10/2017
(Continued)

OTHER PUBLICATIONS

Examination Report dated Apr. 28, 2020 issued to European Patent Application No. EP 3 176 771.
(Continued)

Primary Examiner — Jennifer T Nguyen
(74) Attorney, Agent, or Firm — CANTOR COLBURN LLP

(57) ABSTRACT

A display device includes: a display panel in which a non-display region and a display region surrounding the non-display region are defined, wherein the display panel includes: a base layer comprising a first region in which a hole is defined corresponding to the non-display region, a second region surrounding the first region, and a third region corresponding to the display region; and first signal line parts disposed on the second region and the third region, the first signal line parts arrayed spaced apart from each other in a first direction, and each of the first signal line parts
(Continued)

includes: a first line; a second line spaced apart from the first line; and a first connection part configured to connect the first line and the second line.

20 Claims, 20 Drawing Sheets

Related U.S. Application Data continuation of application No. 17/409,234, filed on Aug. 23, 2021, now Pat. No. 11,450,277, which is a continuation of application No. 16/688,551, filed on Nov. 19, 2019, now Pat. No. 11,100,858.

(51) Int. Cl.
*H10K 59/131* (2023.01)
*H10K 59/65* (2023.01)
*H10K 59/80* (2023.01)
*H10K 59/88* (2023.01)

(52) U.S. Cl.
CPC ......... *H10K 59/65* (2023.02); *H10K 59/8731* (2023.02); *H10K 59/88* (2023.02)

(58) Field of Classification Search
CPC .. H10K 59/88; H10K 59/1216; H10K 59/123; G09G 3/3225; G09G 3/3266; G09G 2300/0426; G09G 2300/08
USPC .......................................................... 345/211
See application file for complete search history.

(56) References Cited

U.S. PATENT DOCUMENTS

| | | | |
|---|---|---|---|
| 10,038,048 | B2 | 7/2018 | Park |
| 10,304,913 | B2 | 5/2019 | Choi et al. |
| 10,651,264 | B2 | 5/2020 | An et al. |
| 11,450,277 | B2 | 9/2022 | An et al. |
| 11,727,879 | B2* | 8/2023 | An ....................... G09G 3/3233 345/211 |
| 2006/0219429 | A1* | 10/2006 | Ikumo .................... H01L 23/13 29/830 |
| 2010/0053058 | A1 | 3/2010 | Nagashima et al. |
| 2016/0190166 | A1 | 6/2016 | Kim et al. |
| 2017/0031323 | A1* | 2/2017 | Kim ................... H10K 59/1213 |
| 2017/0154566 | A1* | 6/2017 | Ryoo ................... H10K 59/131 |
| 2017/0162637 | A1* | 6/2017 | Choi .................... G09G 3/3225 |
| 2017/0287992 | A1 | 10/2017 | Kwak et al. |
| 2017/0288002 | A1 | 10/2017 | Kim et al. |
| 2017/0288003 | A1 | 10/2017 | Kim et al. |
| 2017/0294502 | A1* | 10/2017 | Ka ..................... H10K 59/1213 |
| 2017/0317153 | A1 | 11/2017 | Shin |
| 2018/0157362 | A1 | 6/2018 | Kim et al. |
| 2019/0261512 | A1 | 8/2019 | Huang et al. |
| 2020/0212357 | A1 | 7/2020 | Lim et al. |
| 2021/0343823 | A1 | 11/2021 | Tanaka et al. |

FOREIGN PATENT DOCUMENTS

| | | |
|---|---|---|
| CN | 107293567 A | 10/2017 |
| CN | 107393943 A | 11/2017 |
| CN | 108269520 A | 7/2018 |
| EP | 3 176 771 A2 | 6/2017 |
| JP | 2001242467 | 9/2001 |
| KR | 10-1995-0001410 | 1/1995 |
| KR | 20020054850 A | 7/2002 |
| KR | 10-2017-0015632 | 2/2017 |
| KR | 10-2017-0111827 | 10/2017 |
| KR | 10-2018-0063633 | 6/2018 |
| WO | 0250603 | 6/2002 |

OTHER PUBLICATIONS

European Search Report issued on Aug. 22, 2017 to European Patent Application No. 16 18 4060.
Non-Final Office Action issued on Sep. 30, 2020, in U.S. Appl. No. 16/688,551.
Final Office Action issued on Feb. 4, 2021, in U.S. Appl. No. 16/688,551.
Notice of Allowance issued on Apr. 15, 2021, in U.S. Appl. No. 16/688,551.
Non-Final Office Action dated Jan. 28, 2022, in U.S. Appl. No. 17/409,234.
Notice of Allowance dated May 13, 2022, in U.S. Appl. No. 17/409,234.
Notice of Allowance dated May 27, 2022, in U.S. Appl. No. 17/409,234.
Non-Final Office Action dated Dec. 16, 2022, in U.S. Appl. No. 17/897,202.
Notice of Allowance dated Mar. 29, 2023, in U.S. Appl. No. 17/897,202.

* cited by examiner

DISPLAY DEVICE

CROSS-REFERENCE TO RELATED APPLICATIONS

This application is a Continuation of U.S. patent application Ser. No. 17/897,202, filed Aug. 28, 2022, which is a Continuation of U.S. patent application Ser. No. 17/409,234, filed Aug. 23, 2021, issued as U.S. Pat. No. 11,450,277, which is a Continuation of U.S. patent application Ser. No. 16/688,551, filed Nov. 19, 2019, issued as U.S. Pat. No. 11,100,858, each of which claims priority from and the benefit of Korean Patent Application No. 10-2018-0152681, filed on Nov. 30, 2018, and each of which is hereby incorporated by reference for all purposes as if fully set forth herein.

BACKGROUND

Field

Exemplary implementations of the invention relate generally to a display device, and more particularly, to a display device having improved display quality and provided with an electronic module having improved sensitivity.

Discussion of the Background

Display devices may be devices each including a display panel for displaying an image, an input sensing member for sensing an external input, and various electronic components such as an electronic module. Electronic components may be electrically connected to each other via variously arranged signal lines. The display panel includes a light-emitting element that generates an image. The input sensing member may include sensing electrodes for sensing external inputs. The electronic modules may include a camera, an infrared sensing sensor, a proximity sensor, etc. The electronic module may be disposed under the display panel.

The above information disclosed in this Background section is only for understanding of the background of the inventive concepts, and, therefore, it may contain information that does not constitute prior art.

SUMMARY

Devices constructed according to exemplary embodiments of the invention provide a display device provided with an electronic module having improved sensitivity and improved display quality.

Additional features of the inventive concepts will be set forth in the description which follows, and in part will be apparent from the description, or may be learned by practice of the inventive concepts.

According to one or more exemplary embodiments of the invention, a display device includes: a base layer including a first region, a second region surrounding the first region, and a third region surrounding the second region; first signal line parts disposed on the second region and the third region and arranged spaced apart from each other in a first direction; second signal line parts disposed on the second region and the third region and arranged spaced apart from each other in a second direction crossing the first direction; and pixels disposed on the third region and electrically connected to one first signal line part among the first signal line parts, wherein each of the first signal line parts includes: a first line; a second line spaced apart from the first line; and a first connection part configured to connect the first line and the second line, and at least a portion of the first connection parts of the first signal line parts overlaps at least a portion of the second signal line parts.

The display device may further include an electronic module disposed to overlap the first region when viewed in a plan view.

The first line and the second line may be disposed on the same layer, and the first connection part may be disposed on a layer different from that of the first line and the second line.

The first line and the second line may be disposed on layers different from each other, and the first connection part may be disposed on the same layer as one of the first line and the second line.

The first connection parts may be divided into an overlapped connection part and a non-overlapped connection part, the overlapped connection part may overlap at least the portion of the second signal line parts, and the non-overlapped connection part may not overlap the second signal line parts.

The overlapped connection part may be disposed on the second region, and the non-overlapped connection part may be disposed on the third region.

The overlapped connection part may include a plurality of overlapped connection parts, the non-overlapped connection part may include a plurality of non-overlapped connection parts, the plurality of overlapped connection parts may be arranged spaced apart from each other in the first direction, and the plurality of non-overlapped connection parts may be arranged spaced apart from each other in the first direction.

The overlapped connection part may include a plurality of overlapped connection parts, and two adjacent overlapped connection parts among the plurality of overlapped connection parts may not overlap each other when viewed in the first direction.

The overlapped connection part may include a plurality of overlapped connection parts, one portion of each of two most adjacent overlapped connection parts to each other among the plurality of overlapped connection parts may not overlap each other when viewed in the first direction, and a remaining portion of the two most adjacent overlapped connection parts to each other may overlap each other in the first direction.

The first line may be disposed on the second region, a portion of the first line may extend corresponding to a shape of a boundary between the first region and the second region, and the second line may extend in the second direction.

The first connection part may be connected to at least one of the first line and the second line through a through hole defined in an insulating layer configured to cover at least one of the first line and the second line.

Each of the second signal line parts may include: a third line; a fourth line spaced apart from the third line; and a second connection part configured to connect the third line and the fourth line, and at least a portion of the second connection parts of the second signal line parts may overlap at least a portion of the first signal line parts.

The third line may be disposed on the second region, at least a portion of the third line may extend corresponding to a shape of a boundary between the first region and the second region, the fourth line may extend in the first direction, and a second connection part may be connected to at least one of the third line and the fourth line through a through hole defined in an insulating layer configured to cover at least one of the third line and the fourth line.

A hole may be defined in the first region of the base layer, and the hole may be surrounded by the second region when viewed in a plan view.

The base layer, the first signal line parts, the second signal line parts, and the pixels constitute a display module; a first module region overlapping the first region, a second module region overlapping the second region, and a third module region overlapping the third region may be defined in the display module; and a transmittance of the first module region may be higher than that of the third module region.

According to one or more exemplary embodiments of the invention, a display device includes: a display panel in which a non-display region and a display region surrounding the non-display region are defined, wherein the display panel includes: a base layer comprising a first region in which a hole is defined corresponding to the non-display region, a second region surrounding the first region, and a third region corresponding to the display region; and first signal line parts disposed on the second region and the third region, the first signal line parts arrayed spaced apart from each other in a first direction, and each of the first signal line parts includes: a first line; a second line spaced apart from the first line; and a first connection part configured to connect the first line and the second line.

The first connection part may be disposed to overlap the second region.

The first connection parts of the first signal line parts may be arranged spaced apart from each other in the first direction.

Two adjacent first connection parts may not overlap each other in the first direction.

The display device may further include second signal line parts arranged spaced apart from each other in a second direction crossing the first direction, wherein each of the second signal line parts may include: a third line; a fourth line spaced apart from the third line; and a second connection part configured to connect the third line and the fourth line.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
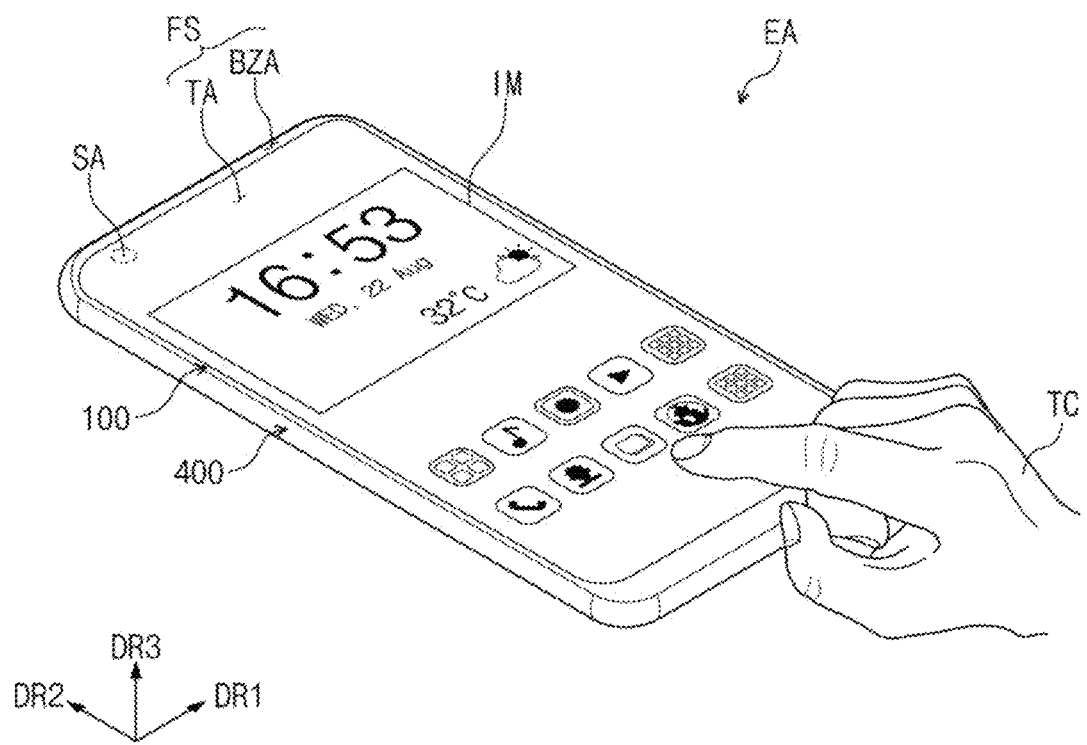
FIG. 1A is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, a DR1-axis, a DR2-axis, and a DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described with reference to the accompanying drawings.

Figure 1B:
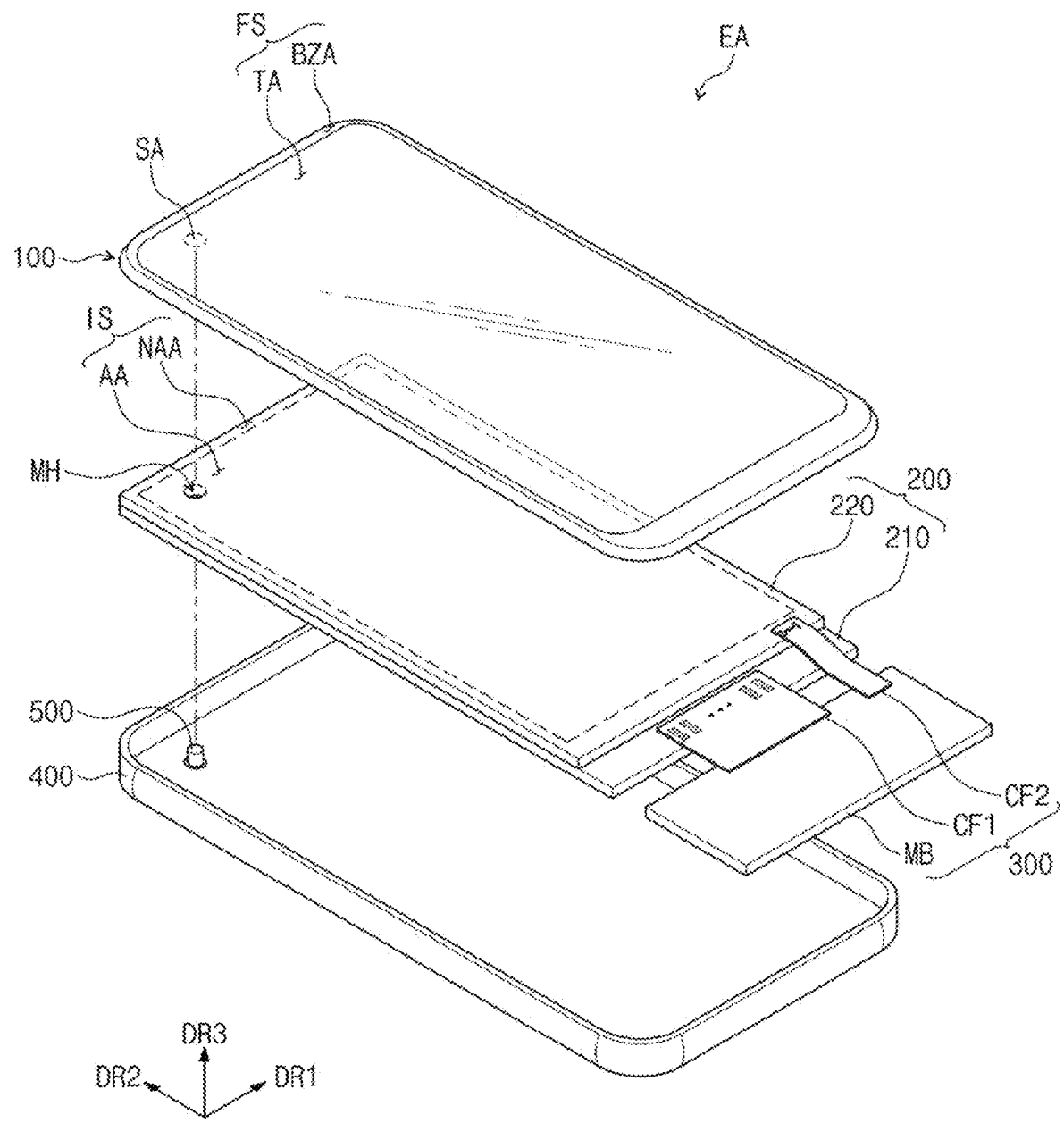
FIG. 1B is an exploded perspective view of a display device according to an exemplary embodiment.
Figure 2:
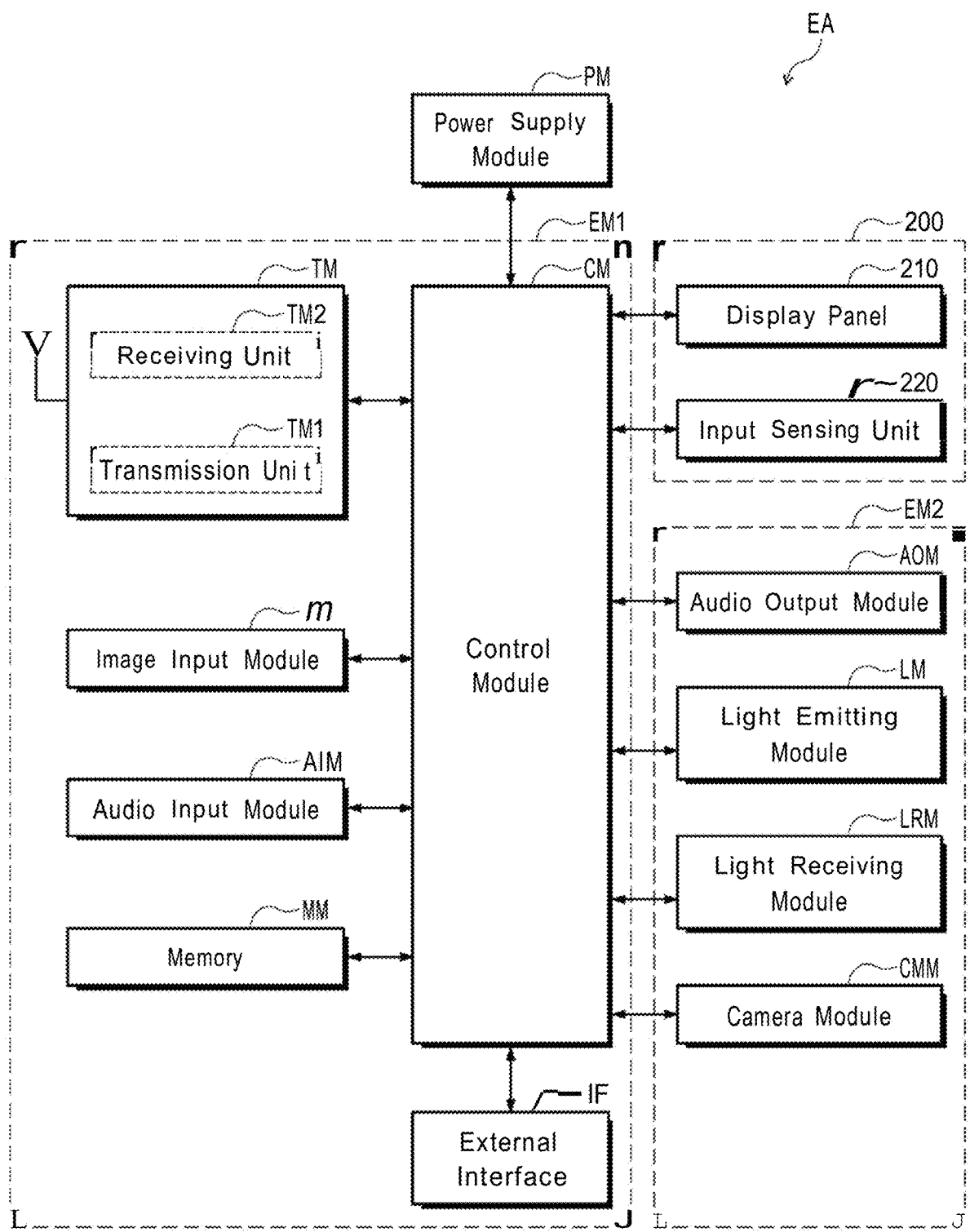
FIG. 2 is a block diagram of a display device according to an exemplary embodiment.

FIG. 1A is a perspective view of a display device according to an exemplary embodiment. FIG. 1B is an exploded perspective view of a display device according to an exemplary embodiment. FIG. 2 is a block diagram of a display device according to an exemplary embodiment. Hereinafter, referring to FIGS. 1A, 1B, and 2, an exemplary embodiment will be described.

A display device EA may be a device activated in response to an electrical signal. The display device EA may include various examples. For example, the display device EA may include a tablet PC, a laptop PC, a television, etc. In this embodiment, the display device EA is exemplarily illustrated as a smartphone.

The display device EA may display an image IM in a third direction DR3 on a display surface FS which is parallel to each of a first direction DR1 and a second direction DR2. The display surface FS on which the image IM is displayed may correspond to the front surface of the display device EA and may correspond to a front surface FS of a window 100. Hereinafter, the display surface and the front surface of the display device EA, and the front surface of the window 100 will be referred by the same reference symbols. The image IM may include not only moving images but also static images. FIG. 1A illustrates a clock window and application icons as examples of the image IM.

In this embodiment, front surface (or upper surface) and rear surface (or lower surface) of each member is defined with respect to the direction in which the image IM is displayed. The front surface and the rear surface may be opposite to each other in the third direction DR3, and the normal direction of each of the front surface and the rear surface may be parallel to the third direction DR3. Meanwhile, the directions indicated by the first to third directions DR1, DR2, and DR3 are relative and may be converted into other directions. Hereinafter, the first to third directions are directions, which the first to third direction DR1, DR2, and DR3 respectively indicate, and referred to by the same reference symbols.

The display device EA may include a window 100, a display module 200, a drive circuit part 300, a housing 400, and an electronic module 500. In this embodiment, the window 100 and the housing 400 may be coupled and constitute the external appearance of the display device EA.

The window 100 may include an optically transparent insulating material. For example, the window 100 may include glass or plastic. The window 100 may have a multilayer structure or single layer structure. For example, the window 100 may include a plurality of plastic films coupled by means of an adhesive, or may include a glass substrate and a plastic film which are coupled by means of an adhesive.

The window 100 may be divided into a transmissive region TA and a bezel region BZA when viewed in a plan view. In this specification, the wording "on a plane" may mean a case of viewing in the third direction DR3. In addition, the "thickness direction" may be the third direction DR3.

The transmissive region TA may be an optically transparent region. The bezel region BZA may be a region having a relatively lower light transmittance than the transmissive region TA. The bezel region BZA may define the shape of the transmissive region TA. The bezel region BZA may be adjacent to the transmissive region TA and surround the transmissive region TA.

The bezel region BZA may have a predetermined color. The bezel region BZA may cover a peripheral region NAA of the display module 200 and prevent or suppress the peripheral region NAA from being viewed from the outside. Meanwhile, this is exemplarily illustrated, and in the window 100 according to an exemplary embodiment, the bezel region BZA may be omitted.

In an exemplary embodiment, a sensing region SA may be a region overlapping the electronic module 500 to be described later. The display device EA may receive an external signal required for the electronic module 500 through the sensing region SA or provide a signal output from the electronic module 500 to the outside. According to the exemplary embodiment, the sensing region SA may be defined to overlap the transmissive region TA. Accordingly, a separate region, which is provided to provide the sensing region SA in a region other than the transmissive region TA, may be omitted. Thus, the area of the bezel region BZA may be reduced.

FIG. 1B exemplarily illustrates that the number of sensing regions SA is one, but the exemplary embodiments are not limited thereto. For example, two or more sensing regions SA may be defined. In addition, FIG. 1B exemplarily illustrates that the sensing region SA is defined on an upper left end of the transmissive region TA, but the sensing region SA may be defined on various regions, such as, on the upper right end of the transmissive region TA, on the central portion of the transmissive region TA, on the lower left end of the transmissive region TAT, or the lower right end of the transmissive region TA.

The display module 200 may be disposed under the window 100. In this specification, the wording "under" may mean the opposite direction of the direction in which the display module 200 provides an image. The display module 200 may display an image IM and detect an external input TC. The display module 200 includes a front surface (also referred to as display surface) IS including an active region AA and a peripheral region NAA. The active region AA may be a region which is activated in response to an electrical signal.

In this embodiment, the active region AA may be a region on which an image IM is displayed, and an external input TC is detected. The transmissive region TA overlaps at least the active region AA. For example, the transmissive region TA overlaps the entirety of or a portion of the active region AA. Accordingly, a user may view an image IM through the transmissive region TA, or provide an external input TC.

The peripheral region NAA may be a region covered by the bezel region BZA. The peripheral region NAA is adjacent to the active region AA. The peripheral region NAA may surround the active region AA. In the peripheral region NAA, a drive circuit, drive wiring, or the like which are for driving the active region AA may be disposed.

In this embodiment, the display module 200 is assembled in a flat state in which the active region AA and the peripheral region NAA face the window 100. However, this is exemplarily illustrated, and a portion of the peripheral region NAA may be bent. At this point, a portion of the peripheral region NAA faces the rear surface of the display device EA, so that the area of the bezel region BZA may be reduced on the front surface of the display device EA. Alternatively, the display module 200 may also be assembled in a state in which a portion of the active region AA is also bent. Alternatively, in the display module 200 according to an exemplary embodiment, the peripheral region NAA may be omitted.

The display module 200 may include a display panel 210 and an input sensing unit 220.

The display panel 210 may be a component which actually generates an image IM. The image IM generated by the display panel 210 is displayed on the display surface IS, and is viewed by a user from the outside through the transmissive region TA.

The input sensing unit 220 detects the external input TC applied from the outside. For example, the input sensing unit 220 may detect the external input TC provided to the window 100. The external input TC may be an input from a user. User's input includes various types of external inputs, such as a portion of user's body, light, heat, pen or pressure.

In this embodiment, the external input TC is illustrated as user's hand applied on the front surface FS. However, this is exemplarily illustrated, and as described above, user's input may be provided in various forms, and the display device EA may also detect user's external input TC applied to a side surface or the rear surface of the display device EA according to the structure of the display device EA, and the exemplary embodiments are not limited to any one embodiment.

The drive circuit part 300 may be electrically connected to the display panel 210 and the input sensing unit 220. The drive circuit part 300 may include a main circuit board MB, a first flexible film CF1, and a second flexible film CF2.

The first flexible film CF1 may be electrically connected to the display panel 210. The first flexible film CF1 may connect the display panel 210 and the main circuit board MB. The first flexible film CF1 may be connected to pads (display pads) of the display panel 210 disposed on the peripheral region NAA. The first flexible film CF1 provides the display panel 210 with an electrical signal for driving the display panel 210. The electrical signal may be generated from the first flexible film CF1 or the main circuit board MB.

The second flexible film CF2 may be electrically connected to the input sensing unit 220. The second flexible film CF2 may connect the input sensing unit 220 and the main circuit board MB. The second flexible film CF2 may be connected to pads (sensing pads) of the input sensing unit 220 disposed on the peripheral region NAA. The second flexible film CF2 provides the input sensing unit 220 with an electrical signal for driving the input sensing unit 220. The electrical signal may be generated from the second flexible film CF2 or the main circuit board MB.

The main circuit board MB may include various drive circuits for driving the display module 200, a connector for power supply, etc. The first flexible film CF1 and the second flexible film CF2 may be connected to the main circuit board MB. According to exemplary embodiments of the inventive concepts, the display module 200 may easily be controlled through the one main circuit board MB. However, this is exemplarily illustrated, in the display module 200 according to an exemplary embodiment, the display panel 210 and the input sensing unit 220 may also be connected to the main circuit boards different from each other, and either the first flexible film CF1 or the second flexible film CF2 may not be connected to the main circuit board MB, and the exemplary embodiments are not limited any one embodiment.

In an exemplary embodiment, one region corresponding to the sensing region SA in the display module 200 may have a relatively higher transmittance than the active region AA which does not overlap the sensing region SA. For example, at least a portion of the components of the display panel 210 and the input sensing unit 220 may be removed. Accordingly, the electronic module 500 which is disposed to overlap the sensing region SA may easily transmit and/or receive a signal through the sensing region SA.

FIG. 1B exemplarily illustrates that a predetermined hole MH (hereinafter referred to as a module hole) is defined in one region of the display module 200 corresponding to the sensing region SA. The module hole MH may be defined in the active region AA and pass through the display module 200. The display panel 210 and the input sensing unit 220 may be passed through by the module hole MH. That is, the module hole MH may be defined such that all the components of the display panel 210 and the input sensing unit 220 disposed to overlap the sensing region SA are removed.

Since the module hole MH is defined in the active region AA, the sensing region SA may be provided within the transmissive region TA.

When viewed in a plan view, the electronic module 500 may overlap the module hole MH and the sensing region SA. The electronic module 500 may be disposed under the display module 200 and at least a portion of the electronic module 500 may also be accommodated inside the module hole MH. The electronic module 500 may receive an external input transmitted through the sensing region SA or provide an output through the sensing region SA.

The housing 400 is coupled to the window 100. The housing 400 is coupled to the window 100 to thereby provide an inner space. The display module 200 and the electronic module 500 may be accommodated in the inner space.

The housing 400 may include a material having relatively high stiffness. For example, the housing 400 may include glass, plastic, or metal, or include a plurality of frames and/or plates composed of combinations thereof. The housing 400 may stably protect the components of the display device EA accommodated in the inner space from external shocks.

Referring to FIG. 2, a display device EA may include a display module 200, a power supply module PM, a first electronic module EM1, and a second electronic module EM2. The display module 200, the power supply module PM, the first electronic module EM1, and the second electronic module EM2 may be electrically connected to each other.

The power supply module PM supplies power required for overall operations of the display device EA. The power supply module PM may include a normal battery module.

The first electronic module EM1 and the second electronic module EM2 may include various functional modules for operating the display device EA.

The first electronic module EM1 may be directly mounted on a mother board electrically connected to the display module 200, or be mounted on a separate board and electrically connected to the mother board through a connector or the like.

The first electronic module EM1 may include a control module CM, a wireless communication module TM, an image input module IIM, an audio input module AIM, a memory MM, and an external interface IF. Some of the modules may not be mounted on the mother board, but may also be electrically connected to the mother board through a flexible circuit board.

The control module CM controls the overall operations of the display device EA. The control module CM may be a microprocessor. For example, the control module CM may activate or deactivate the display module 200. The control module CM may control other modules such as the image input module IIM or the audio input module AIM on the basis of a touch signal received from the display module 200.

The wireless communication module TM may transmit/receive a wireless signal to/from another terminal using a Bluetooth or WiFi line. The wireless communication module TM may transmit/receive an audio signal using a general communication line. The wireless communication module TM may include a transmission unit TM1 which modulates and transmits a signal to be transmitted and a receiving unit TM2 which demodulates a received signal.

The image input module IIM processes an image signal and converts the image signal into image data which may be displayed on the display module 200. The audio input module AIM receives an external audio signal through a microphone in a recording mode, a voice recognition mode, etc., and converts the audio signal into an electrical voice data.

The external interface IF may function as an interface connected to an external charger, a wired/wireless data port, a card (for example, memory card or SIM/UIM card), socket or the like.

The second electronic module EM2 may include an audio output module AOM, a light-emitting module LM, a light-receiving module LRM, a camera module CMM, and the like. The components may be directly mounted on the mother board, be mounted on a separate board and electrically connected to the display module 200 through a connector or the like, or be electrically connected to the first electronic module EM1.

The audio output module AOM converts audio data received from the wireless communication module TM or audio data stored in the memory MM and outputs the converted audio data to the outside.

The light-emitting module LM generates and outputs light. The light-emitting module LM may output an infrared ray. The light-emitting module LM may include an LED element. The light-receiving module LRM may detect an infrared ray. The light-receiving module LRM may be activated when an infrared ray of at least a predetermined level is detected. The light-receiving module LRM may include a CMOS sensor. After the infrared light generated from the light-emitting module LM is output, the infrared ray is reflected from an external object (for example, user's finger or face), and the reflected infrared ray may be incident on the light-receiving module LRM. The camera module CMM may capture an image of the outside.

The electronic module 500 according to an exemplary embodiment may include at least any one of the components of the first electronic module EM1 or the second electronic module EM2. For example, the electronic module 500 may include at least any one of an audio output module AOM, a light-emitting module LM, a light-receiving module LRM, a camera module CMM, a heat sensing module or the like. The electronic module 500 may detect an external subject received through the sensing region SA, or provide an audio signal, such as voice, or light, such as an infrared ray, to the outside. In addition, the electronic module 500 may also include a plurality of modules, and the exemplary embodiments are not limited to any one embodiment.

In exemplary embodiments, the display module 200, the first electronic module EM1, the second electronic module EM2, the power supply module PM, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the display module 200, the first electronic module EM1, the second electronic module EM2, the power supply module PM, and/or one or more components thereof may include or otherwise be associated with one or more memories including code (e.g., instructions) configured to cause the display module 200, the first electronic module EM1, the second electronic module EM2, the power supply module PM, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 3:
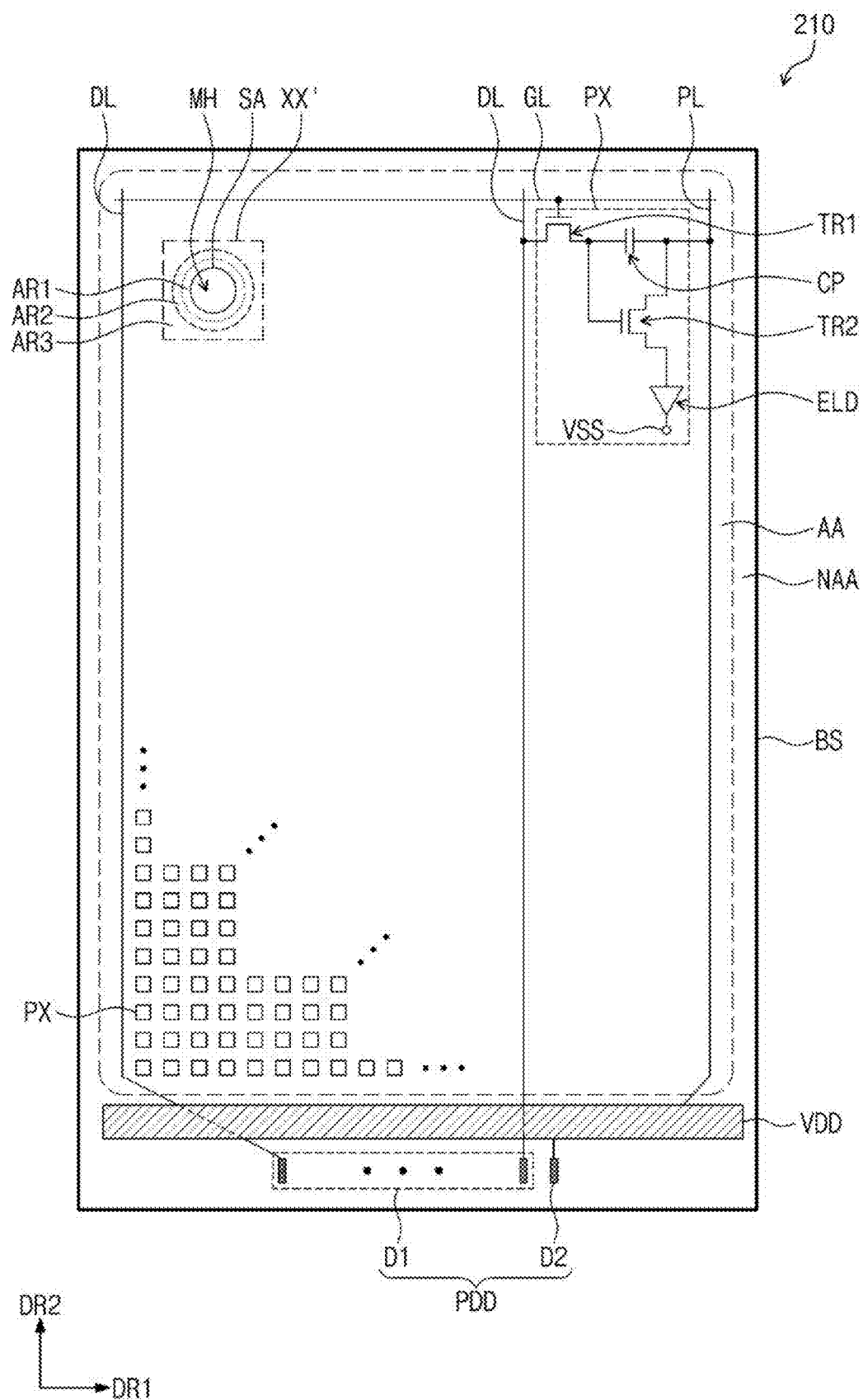
FIG. 3 is a plan view of a display panel according to an exemplary embodiment.

FIG. 3 is a plan view of a display panel according to an exemplary embodiment.

Referring to FIG. 3, the display panel 210 may include a base layer BS, a plurality of pixels PX, a plurality of signal lines GL, DL, and PL, and a plurality of display pads PDD.

An active region AA of the display panel 210 is a region on which an image is displayed, and a peripheral region NAA may be a region on which a drive circuit, drive lines, or the like are disposed. FIG. 3 illustrates the active region AA and the peripheral region NAA of the display panel 210. A plurality of pixels PX may be disposed in the active region AA.

The base layer BS may be a laminated structure including a silicon substrate, a plastic substrate, a glass substrate, an insulating film or a plurality of insulating layers.

The base layer BS may include a first region AR1, a second region AR2, and a third region AR3. When viewed in a plan view, the second region AR2 may surround the first region AR1, and the third region AR3 may surround the second region AR2. The first region AR1, the second region AR2, and the third region AR3 may be surrounded by the peripheral region NAA. The plurality of pixels PX may be disposed on the third region AR3. That is, the third region AR3 may correspond to the active region AA.

At least a portion of the first region AR1 may be a region overlapping a sensing region SA when viewed in a plan view. A module hole MH may be defined in at least the portion of the first region AR1. That is, the components of the display panel 210 may be removed from the region corresponding to the sensing region SA, or may be disposed so as not to overlap the sensing region SA. When viewed in a plan view, the first region AR1 may surround the module hole MH. On the first region AR1, a structure, such as a groove part or a dam part, for blocking a penetration path of external moisture of oxygen may be disposed, and this will be described later.

The pixels PX which provide an image may not be disposed on the first region AR1 and the second region AR2 of the base layer BS. Accordingly, in the display panel 210, the region including the first region AR1 and the second region AR2 of the base layer BS may be defined as a non-display region. The plurality of pixels PX may be disposed on the third region AR3 of the base layer BS. Accordingly, the region including the third region AR3 of the base layer BS may be defined as a display region. That is, the display region of the display panel 210 may correspond to the third region AR3 of the base layer BS, and the non-display region of the display panel 210 may correspond to the first region AR1 and the second region AR2 of the base layer BS.

According to an exemplary embodiment, the non-display region surrounded by the display region may be disposed when viewed in a plan view. The non-display region may be a region overlapping the electronic module 500 (see FIG. 1B). Accordingly, a separate region provided for providing sensing regions on the outer periphery of the display region may be omitted, and thus, the area of the bezel region may be reduced. The bezel region may mean the region surrounding the display region.

The plurality of signal lines GL, DL, and PL are connected to the pixels PX, and electrical signals are transmitted to the pixels PX. Among the signal lines included in the display panel 210, scan lines GL, data lines DL, and power supply lines (hereinafter, also referred to as power lines) PL are exemplarily illustrated. However, this is exemplarily illustrated, and the signal lines GL, DL, and PL may also include at least any one of initial voltage lines, light-emitting lines, and the exemplary embodiments are not limited to any one embodiment.

The plurality of signal lines GL, DL, and PL may be disposed on the second region AR2 and the third region AR3. The plurality of signal lines GL, DL, and PL may not be disposed on the first region AR1.

In this embodiment, an equivalent circuit diagram of a single pixel PX among the plurality of pixels PX is enlarged and exemplarily illustrated. The pixel PX may include a first transistor TR1, a capacitor CP, a second transistor TR2, and a light-emitting element ELD. The first transistor TR1 may be a switching element which controls on-off of the pixel PX. The first transistor TR1 may respond to a scan signal transmitted through a scan line GL and transmit or block a data signal transmitted through a data line DL.

The capacitor CP is connected to the first transistor TR1 and the power line PL. The capacitor CP charges an amount of charges corresponding to the difference between the data signal transmitted from the first transistor TR1 and a first power supply signal applied to the power line PL.

The second transistor TR2 is connected to the first transistor TR1, the capacitor CP, and the light-emitting element ELD. The second transistor TR2 controls a drive current flowing through the light-emitting element ELD corresponding to an amount of charges stored in the capacitor CP. According to the amount of charges charged to the capacitor CP, the turn-on time of the second transistor TR2 may be determined. The second transistor TR2 provides the light-emitting element ELD with a first power supply signal transmitted through the power supply line PL during the turn-on time.

The light-emitting element ELD may generate light in response to an electrical signal and control an amount of light. For example, the light-emitting element ELD may include an organic light-emitting element or a quantum dot light-emitting element.

The light-emitting element ELD is connected to a power supply terminal VSS and receives a power supply signal (hereinafter, referred to as a second power supply signal) different from the first power supply signal provided through the power line PL. A drive current, corresponding to the difference between the first power supply signal provided from the second transistor TR2 and the second power supply signal, flows through the light-emitting element ELD, and the light-emitting element ELD may generate light corresponding to the drive current. Meanwhile, this is exemplarily illustrated, and the pixel PX may include electronic elements having various configurations and arrays, and the exemplary embodiments are not limited to any one embodiment.

The power supply pattern VDD is disposed on the peripheral region NAA. In this embodiment, the power supply pattern VDD is connected to the plurality of power supply lines PL. Accordingly, the display panel 210 includes the power supply pattern VDD and may thereby provide the plurality of pixels PX with the substantially the same first power supply signal.

The display pads PDD may include a first pad D1 and a second pad D2. The first pad D1 may be provided in plurality and connected to the data lines DL. The second pad D2 may be connected to the power supply pattern VDD and electrically connected to the power supply line PL. The display panel 210 may provide the pixels PX with electrical signals provided from the outside through the display pads PDD. Meanwhile, the display pads PDD may further include pads for receiving other electrical signals aside from the first pad D1 and the second pad D2, but the exemplary embodiments are not limited to any one embodiment.

Figure 4:
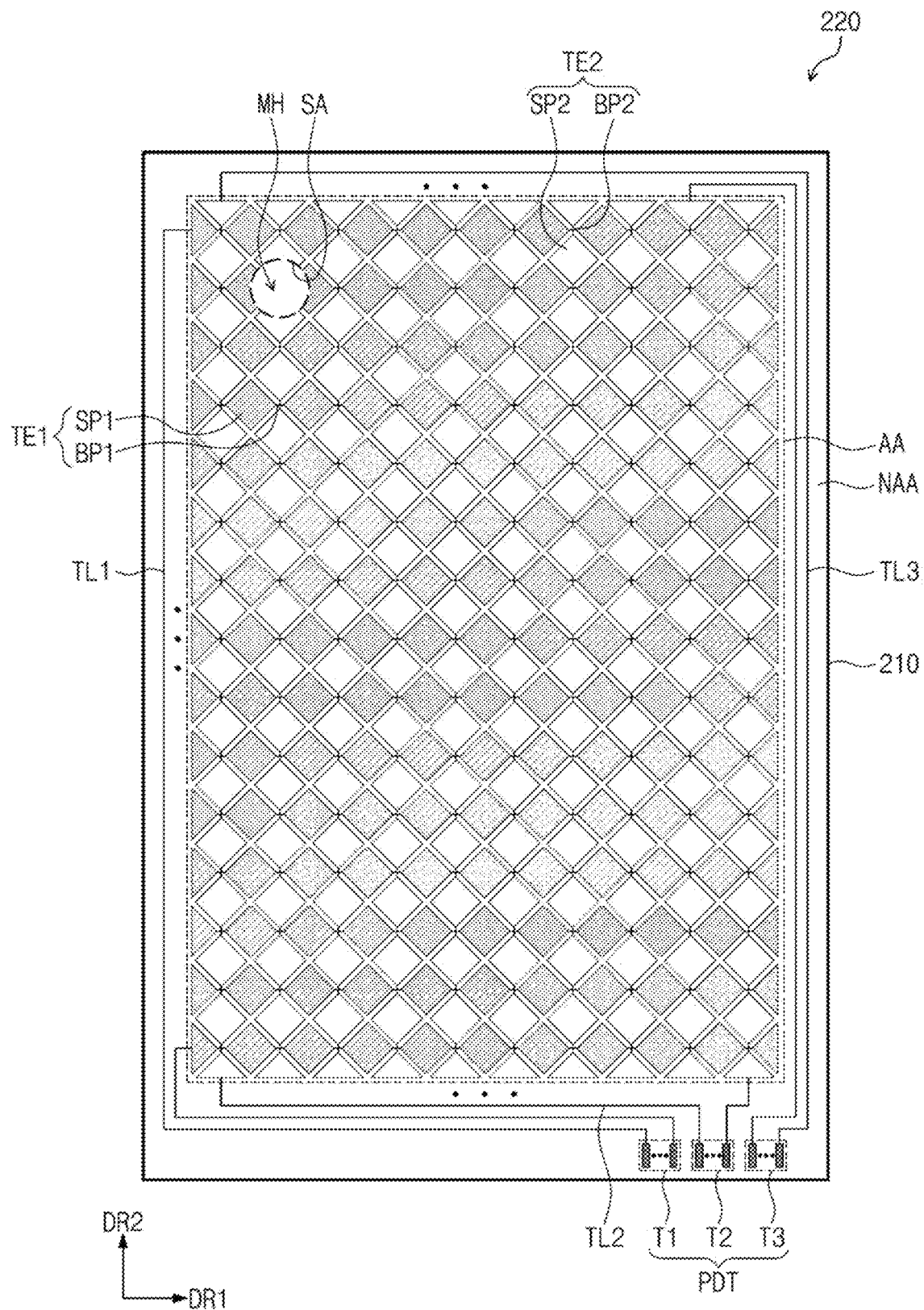
FIG. 4 is a plan view of an input sensing part according to an exemplary embodiment.

FIG. 4 is a plan view of an input sensing part according to an exemplary embodiment.

Referring to FIG. 4, an input sensing unit 220 may be disposed on a display panel 210. For example, the input sensing unit 220 may be disposed directly on the display panel 210, or may also be coupled to the display panel 210 through an adhesive member. When the input sensing unit 220 is formed by a continuous process after forming the display panel 210 (see FIG. 1B), the input sensing unit 220 may be referred to as an input sensing layer. In addition, when the input sensing unit 220 is coupled to the display panel 210 through an adhesive member, the input sensing unit 220 may be referred to as an input sensing panel.

The input sensing unit 220 includes a first sensing electrode TE1, a second sensing electrode TE2, a plurality of sensing lines TL1, TL2, and TL3, and a plurality of sensing pads PDT.

The first sensing electrode TE1 and the second sensing electrode TE2 are disposed in an active region AA. The input sensing unit 220 may acquire information about an external input TC (see FIG. 1A) through a change in the electrostatic capacity between the first sensing electrode TE1 and the second sensing electrode TE2.

The first sensing electrode TE1 may include first sensing patterns SP1 and first connection patterns BP1. At least one first connection pattern BP1 may be connected to two first sensing patterns SP1 adjacent to each other. The second sensing electrode TE2 may include second sensing patterns SP2 and second connection patterns BP2. At least one second connection pattern BP2 may be connected to two second sensing patterns SP2 adjacent to each other.

The sensing lines TL1, TL2, and TL3 are disposed in a peripheral region NAA. The sensing lines TL1, TL2, and TL3 may include the first sensing line TL1, the second sensing line TL2, and the third sensing line TL3.

The first sensing line TL1 is connected to the first sensing electrode TEL The second sensing line TL2 is connected to one end of the second sensing electrode TE2. The third sensing line TL3 is connected to the other end of the second sensing electrode TE2. The other end of the second sensing electrode TE2 may be a portion facing the one end of the second sensing electrode TE2.

According to an exemplary embodiment, the second sensing electrode TE2 may be connected to the second sensing line TL2, and the third sensing line TL3. Accordingly, sensitivity may be uniformly maintained according to regions with respect to the second sensing electrode TE2 having a relatively larger length than the first sensing electrode TE1. Meanwhile, this is exemplarily illustrated, and the third sensing line TL3 may be omitted, and the exemplary embodiments are not limited to any one embodiment.

The sensing pads PDT are disposed on the peripheral region NAA. The sensing pads PDT may include a first sensing pad T1, a second sensing pad T2, and a third sensing pad T3. The first sensing pad T1 is connected to the first sensing line TL1 and thereby electrically connected to the first sensing electrode TE1. The second sensing pad T2 is connected to the second sensing line TL2, and the third sensing pad T3 is connected to the third sensing line TL3. Accordingly, the second sensing pad T2 and the third sensing pad T3 are electrically connected to the second sensing electrode TE2.

A portion of the input sensing unit 220 may be removed from the region corresponding to a sensing region SA. For example, a portion of the first sensing electrode TE1 and a portion of the second sensing electrode TE2 may not be disposed in the sensing region SA. In this embodiment, the first sensing electrode TE1 disposed to overlap the sensing region SA includes a first sensing pattern having a shape with a removed portion, and the second sensing electrode TE2 may include a second sensing pattern having a shape with a removed portion.

According to an exemplary embodiment, portions of the sensing electrodes TE1 and TE2 in the region overlapping the sensing region SA may be removed, so that the problem may be prevented in which an electronic module 500 (see FIG. 1B) is occluded by the first sensing electrode TE1 or the second sensing electrode TE2. Thus, the sensitivity of the electronic module 500 may be improved.

Figure 5:
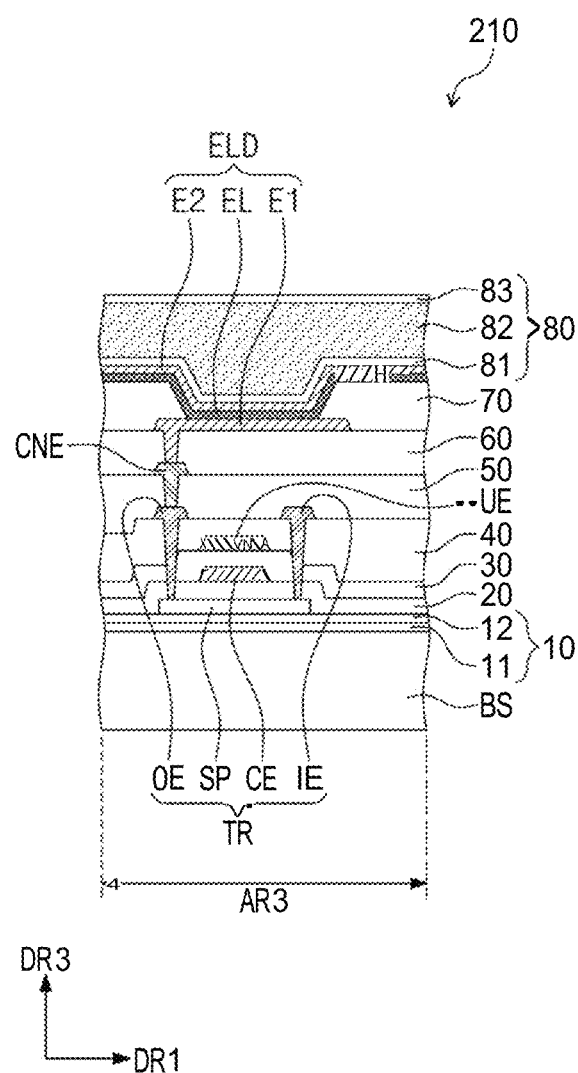
FIG. 5 is a cross-sectional view of a display panel according to an exemplary embodiment.
Figure 6:
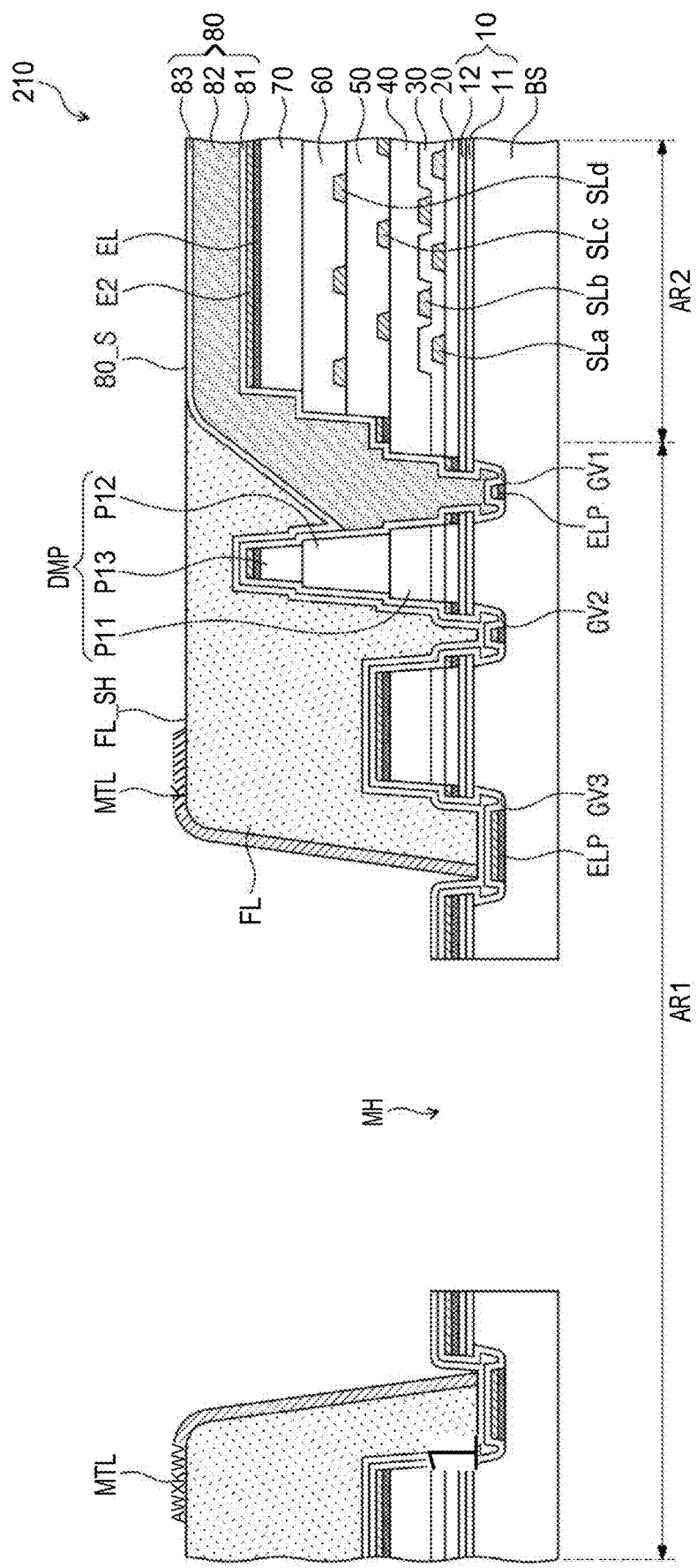
FIG. 6 is a cross-sectional view of a display panel according to an exemplary embodiment.

FIG. 5 is a cross-sectional view of a display panel according to an exemplary embodiment. FIG. 6 is a cross-sectional view of a display panel according to an exemplary embodiment. FIG. 5 is a cross-sectional view of a display panel 210 including a third region AR3 of a base layer BS, and FIG. 6 is a cross-sectional view of the display panel 210 including a first region AR1 and a second region AR2 of the base layer BS.

Referring to FIGS. 5 and 6, a first insulating layer 10 is disposed on the base layer BS. The first insulating layer 10 may include a barrier layer 11 and a buffer layer 12.

The barrier layer 11 may include an inorganic material. The barrier layer 11 may prevent oxygen or moisture introduced through the base layer BS from penetrating into pixels PX (see FIG. 3). The buffer layer 12 may include an inorganic material. The buffer layer 12 may provide the pixels PX with lower surface energy than the base layer BS so that the pixels PX may stably be formed on the base layer BS. FIG. 5 illustrates each of the barrier layer 11 and the buffer layer 12 as a single layer. However, this is exemplarily illustrated, and the barrier layer 11 and the buffer layer 12 according to an exemplary embodiment may be provided in plurality and also be alternately laminated with each other.

Alternatively, at least any one of the barrier layer 11 or the buffer layer 12 may be provided in plurality and also be omitted.

Each of the pixels PX (see FIG. 3) may include a pixel circuit and a light-emitting element ELD. The pixel circuit may include transistors TR, a capacitor, and the like. FIG. 5 illustrates only one transistor TR. The transistor TR may be the second transistor TR2 described in FIG. 3.

The transistor TR may be disposed on the first insulating layer 10. The transistor TR includes a semiconductor pattern SP, a control electrode CE, an input electrode IE, and an output electrode OE. The semiconductor pattern SP is disposed on the first insulating layer 10. The semiconductor pattern SP may include a semiconductor material. The control electrode CE is spaced apart from the semiconductor pattern SP with a second insulating layer 20 disposed therebetween. The control electrode CE may be connected to the first transistor TR1 and one electrode of the capacitor CP which are described in FIG. 3.

The input electrode IE and the output electrode OE are spaced apart from the control electrode CE with a third insulating layer 30 and a fourth insulating layer 40 disposed therebetween. The input electrode IE and the output electrode OE pass through the second insulating layer 20, the third insulating layer 30, and the fourth insulating layer 40 and are each connected to one side and the other side of the semiconductor pattern SP.

An upper electrode UE may be disposed between the third insulating layer 30 and the fourth insulating layer 40. The upper electrode UE may be connected to the other electrode of the capacitor CP described in FIG. 3.

A fifth insulating layer 50 is disposed on the fourth insulating layer 40 and covers the input electrode IE and the output electrode OE. The fourth insulating layer 40 may include an organic material and/or an inorganic material, and may have a single layer or a laminated structure.

A connection electrode CNE may be disposed on the fifth insulating layer 50. The connection electrode CNE may be connected to the output electrode OE. A sixth insulating layer 60 may be disposed on the connection electrode CNE.

The transistor TR according to an exemplary embodiment may be formed in various structures, and the exemplary embodiments are not limited to the embodiment illustrated in FIG. 5.

The light-emitting element ELD is disposed on the sixth insulating layer 60. The light-emitting element ELD may include a first electrode E1, a light-emitting layer EL, and a second electrode E2. The first electrode E1 may pass through the sixth insulating layer 60 and be electrically connected to the transistor TR through the connection electrode CNE.

A seventh insulating layer 70 may be disposed on the sixth insulating layer 60. An opening is defined in the seventh insulating layer 70, and the opening may expose at least a portion of the first electrode E1. The seventh insulating layer 70 may be a pixel definition film.

The light-emitting layer EL may be disposed on the first electrode E1 exposed by the opening defined in the seventh insulating layer 70. The light-emitting layer EL may include a light-emitting material. For example, the light-emitting layer may be composed of at least any one of materials which emit red, green or blue light. The light-emitting layer EL may include a fluorescent material or a phosphorescent material. The light-emitting layer EL may include an organic light-emitting material or an inorganic light-emitting material. The light-emitting layer EL may emit light in response to a potential difference between the first electrode E1 and the second electrode E2.

The second electrode E2 may be disposed on the light-emitting layer EL. The second electrode E2 may have an integrated shape extending to a peripheral region NAA (see FIG. 3) from an active region AA (see FIG. 3). The second electrode E2 may commonly be provided to the plurality of pixels PX (see FIG. 3). Each light-emitting element ELD disposed on each of the pixels PX receives a common second power supply voltage through the second electrode E2.

The second electrode E2 may include a transmissive conductive material or a semi-transmissive conductive material. Accordingly, the light generated from the light-emitting layer EL may easily be emitted in the third direction DR3 through the second electrode E2. However, this is exemplarily illustrated, and the light-emitting element ELD according to an exemplary embodiment may be driven in a rear surface light-emitting type in which the first electrode E1 includes a transmissive or semi-transmissive material according to design, or also be driven in a both surface light-emitting type in which light is emitted toward both the front and rear surfaces, and the exemplary embodiments are not limited to any one embodiment.

An eighth insulating layer 80 is disposed on the light-emitting element ELD and encapsulates the light-emitting element ELD. In this embodiment, the eighth insulating layer 80 may be an encapsulation layer. The eighth insulating layer 80 may have an integrated shape extending to the peripheral region NAA (see FIG. 3) from the active region AA (see FIG. 3). Meanwhile, although not shown, a capping layer which covers the second electrode E2 may further be disposed between the second electrode E2 and the eighth insulating layer 80.

The eighth insulating layer 80 may include a first inorganic layer 81, an organic layer 82, and a second inorganic layer 83 which are sequentially laminated in the third direction DR3. In this embodiment, the first inorganic layer 81, the organic layer 82, and the second inorganic layer 83 are each illustrated as a single layer. However, this is exemplarily illustrated, and at least any one of the first inorganic layer 81, the organic layer 82, and the second inorganic layer 83 may be provided in plurality or be omitted, and the exemplary embodiments are not limited to any one embodiment.

The first inorganic layer 81 may cover the second electrode E2. The first inorganic layer 81 may prevent external moisture and oxygen from penetrating into the light-emitting element ELD. For example, the first inorganic layer 81 may include a silicon nitride, a silicon oxide, or a compound of combinations thereof. The first inorganic layer 81 may be formed through a deposition process.

The organic layer 82 may be disposed on the first inorganic layer 81 and contact the first inorganic layer 81. The organic layer 82 may provide a flat surface on the first inorganic layer 81. Specifically, the organic layer 82 may provide the active region AA with a flat surface.

Unevenness formed on the first inorganic layer 81, particles present on the first inorganic layer 81, or the like may be covered by the organic layer 82, and influences on the components, formed on the organic layer 82, from the surface state of the upper surface of the first inorganic layer 81 may be prevented. In addition, the organic layer 82 may mitigate stresses between contacting layers. The organic layer 82 may include an organic material, and may be formed through a solution processes such as spin coating, slit coating, or inkjet process.

The second inorganic layer 83 is disposed on the organic layer 82 and covers the organic layer 82. The second inorganic layer 83 may be more stably formed on a relatively flat surface than on the first inorganic layer 81. The second inorganic layer 83 encapsulates moisture etc., discharged from the organic layer 82, and prevents moisture etc. from flowing toward the outside. The second inorganic layer 83 may include a silicon nitride, a silicon oxide, or a compound of combinations thereof. The second inorganic layer 83 may be formed through a deposition process.

Referring to FIG. 6, groove parts GV1, GV2, and GV3 may be defined in a first region AR1 of a base layer BS in the vicinity of a module hole MH. In addition, a dam part DMP may be disposed on the first region AR1 of the base layer BS.

Each of the groove parts GV1, GV2, and GV3 may be defined to be recessed from the upper surface of the base layer BS. Each of the groove parts GV1, GV2, and GV3 may be formed such that at least a portion of the base layer BS is removed. Deposition patterns ELP may be disposed on each of the groove parts GV1, GV2, and GV3, and the deposition patterns ELP may be covered by at least any one of the first inorganic layer 81 and the second inorganic layer 83.

A display panel 210 according to an exemplary embodiment further includes the groove parts GV1, GV2, and GV3 and thereby blocks continuity between the deposition pattern ELP and the light-emitting elements ELD. Accordingly, a penetration path of external moisture or oxygen is blocked, and the damage to the elements disposed in an active region AA (see FIG. 3) may be prevented.

In addition, the deposition pattern ELP disposed on each of the groove parts GV1, GV2, and GV3 is covered by the first inorganic layer 81 or the second inorganic layer 83, so that the influence to other elements from the deposition pattern ELP may be prevented when manufacturing the display panel 210. Thus, the process reliability of the display panel 210 may be improved. Meanwhile, this is exemplarily illustrated, and in the display panel 210 according to an exemplary embodiment, the groove parts GV1, GV2, and GV3 may be provided as a single groove or omitted, and the exemplary embodiments are not limited to any one embodiment.

The groove parts GV1, GV2, and GV3 may be defined to be spaced apart from each other. The groove parts GV1, GV2, and GV3 are exemplarily illustrated as the first to third groove parts GV1, GV2, and GV3 which are formed to be spaced apart from a second region AR2 and sequentially formed in the direction approaching the module hole MH. Each of the first to third groove parts GV1, GV2, and GV3 may have a closed-line shape surrounding the module hole MH, and may also have an intermittent-line shape surrounding at least a portion of the periphery of the module hole MH, and the exemplary embodiments are not limited to any one embodiment.

The dam part DMP is disposed on the first region AR1, so that the formation region of the organic layer 82 is defined within a predetermined region and additional expansion of the organic layer 82 is prevented. The dam part DMP may be provided in plurality and disposed between groove parts GV1, GV2, and GV3. The dam part DMP is illustrated as a laminating structure including first to third layers P11, P12, and P13. However, this is only an example, the dam part DMP may also have a single layer structure, and the exemplary embodiments are not limited to any one embodiment.

A cover layer FL may be disposed on the first region AR1. For example, the cover layer FL may cover a non-flat surface formed by the dam part DMP or the groove parts GV1, GV2, and GV3 to provide a flat surface FL_SH. The flat surface FL_SH defined by the cover layer FL may define a plane substantially the same as a flat surface 80_S substantially defined by the eighth insulating layer 80.

The display panel 210 may further include a metal pattern MTL. The metal pattern MTL may be disposed on the first region AR1. The metal pattern MTL may be disposed along the periphery of the module hole MH and cover at least a portion of the cover layer FL. The metal pattern MTL may prevent the cover layer FL from being damaged by laser or the like when the module hole MH is formed. In addition, the metal pattern MTL may press the cover layer FL to thereby prevent the phenomenon in which the cover layer FL floats.

Signal lines SLa, SLb, SLc, and SLd may be disposed on the second region AR2 of the base layer BS. The signal lines SLa, SLb, SLc, and SLd may include the first line SLa, the second line SLb, the third line SLc, and the fourth line SLd. Some of the signal lines SLa, SLb, SLc, and SLd may be scan lines GL (see FIG. 3) and the others may be data lines DL (see FIG. 3). For example, the first line SLa and the second line SLb may be the scan lines GL, and the third line SLc and the fourth line SLd may be the data lines DL.

The first line SLa may be disposed between the second insulating layer 20 and the third insulating layer 30. The first line SLa may be disposed on the same layer as the control electrode CE. The second line SLb may be disposed between the third insulating layer 30 and the fourth insulating layer 40. The second line SLb may be disposed on the same layer as the upper electrode UE. The third line SLc may be disposed between the fourth insulating layer 40 and the fifth insulating layer 50. The third line SLc may be disposed on the same layer as the output electrode OE and the input electrode IE. The fourth line SLd may be disposed between the fifth insulating layer 50 and the sixth insulating layer 60. The fourth line SLd may be disposed on the same layer as the connection electrode CNE.

Figure 7:
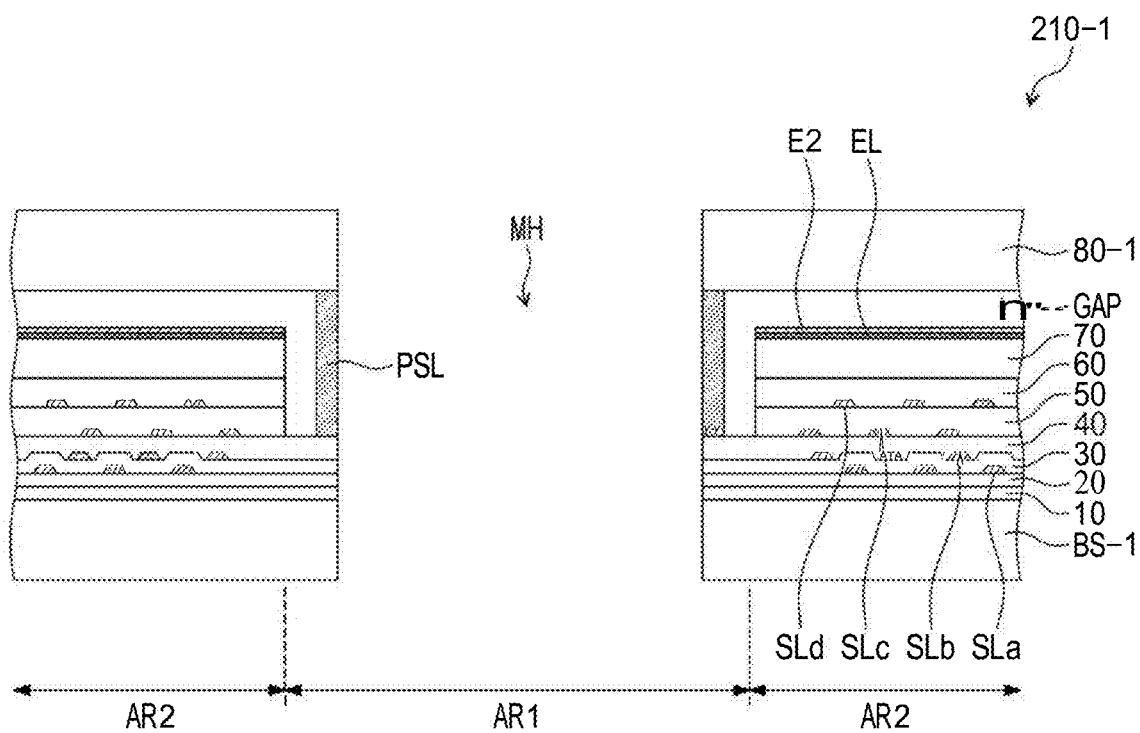
FIG. 7 is a cross-sectional view of a display panel according to an exemplary embodiment.

FIG. 7 is a cross-sectional view of a display panel according to an exemplary embodiment. FIG. 7 is a cross-sectional view of a display panel 210-1 including a first region AR1 and a second region AR2 of a base layer BS. In describing FIG. 7, portions having difference from FIG. 6 will be described, and the same components as the components described in FIG. 6 are referred to by the same reference symbols and the overlapping description will not be provided.

Referring to FIG. 7, a display panel 210-1 may include a base layer BS-1 and an encapsulation substrate 80-1.

The encapsulation substrate 80-1 may be disposed on a second electrode E2. The encapsulation substrate 80-1 and the second electrode E2 may be spaced apart from each other. A space GAP between the encapsulation substrate 80-1 and the second electrode E2 may be filled with air or an inactive gas. In addition, in an exemplary embodiment, the space GAP may also be filled with filling material such as a silicon-based polymer, an epoxy-based resin, or an acrylic resin.

The encapsulation substrate 80-1 may be coupled the base layer BS-1 through a sealing member PSL. The encapsulation substrate 80-1 may be disposed on the base layer BS-1 while maintaining a predetermined gap through the sealing member PSL.

The sealing member PSL may be a component which defines the inner surface of a module hole MH. The sealing member PSL may include an organic material such as a photocurable resin thermoplastic resin, or inorganic material such as a frit seal, and the exemplary embodiments are not limited to any one embodiment.

Figure 8:
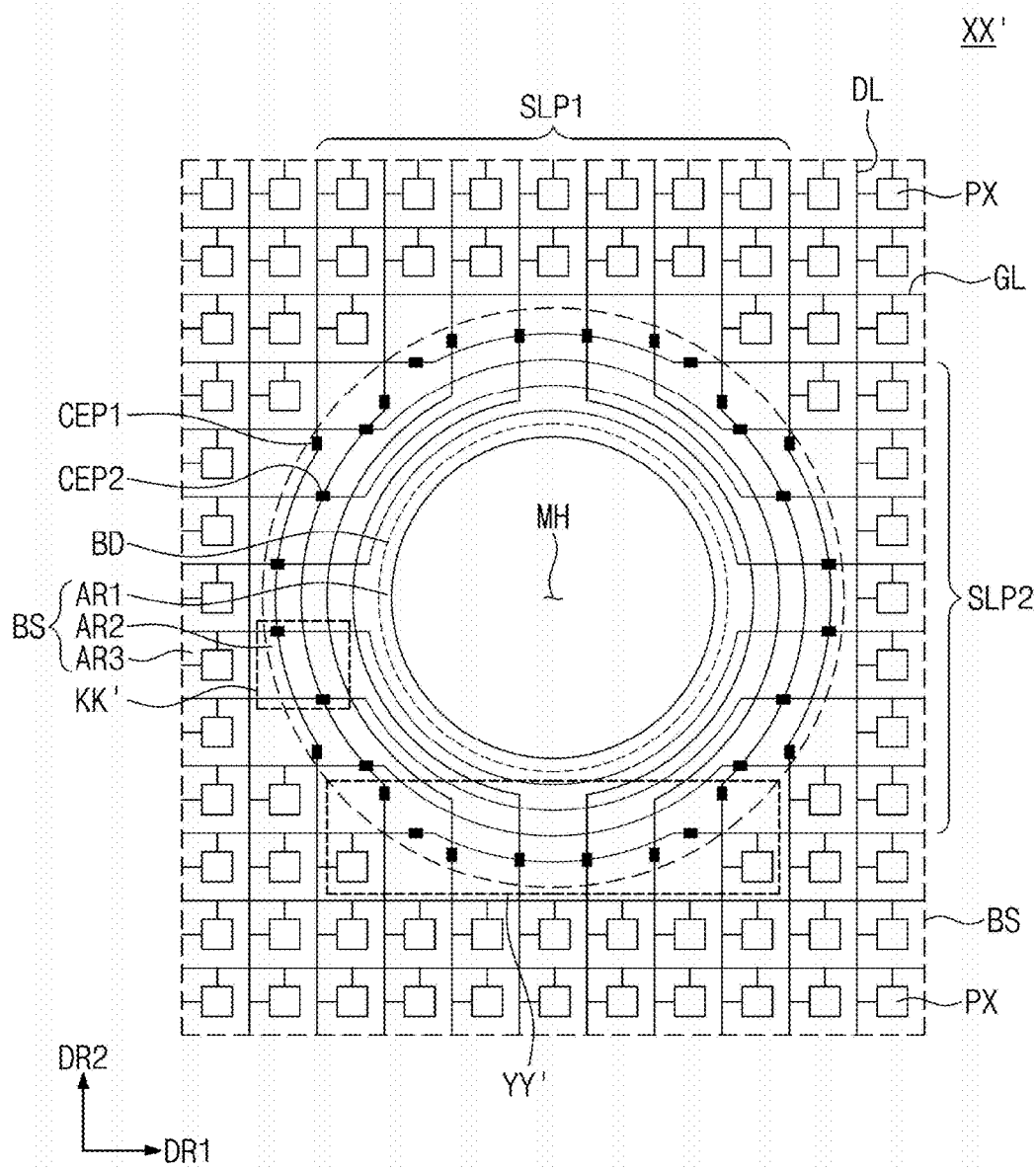
FIG. 8 is an enlarged plan view showing region XX' shown in FIG. 3.

FIG. 8 is an enlarged plan view illustrating the region XX' shown in FIG. 3.

Referring to FIG. 8, a base layer BS may include a first region AR1, a second region AR2, and a third region AR3. A module hole MH may be defined within the first region AR1. Accordingly, the first region AR1 may surround the peripheral portion of the module hole MH. The second region AR2 may surround the first region AR1. The third region AR3 may surround the second region AR2.

On the second region AR2 and the third region AR3, first signal line parts SLP1 and second signal line parts SLP2 may be disposed. Lines, among data lines DL, passing over the second region AR2 may be referred to as the first signal line parts SLP1, and lines, among scan lines GL, passing over the second region AR2 may be referred to as the second signal line parts SLP2. That is, each of the first signal line parts SLP1 and the second signal line parts SLP2 may be respectively disposed on the second region AR2 and the third region AR3.

The first signal line parts SLP1 may be arrayed in the first direction DR1 so as to be spaced apart from each other, and the second signal line parts SLP2 may be arrayed in the second direction DR2 so as to be spaced apart from each other.

A boundary BD between the first region AR1 and the second region AR2 may have a circular shape. Portions of each of the first signal line parts SLP1 and the second signal line parts SLP2, the portions being disposed on the second region AR2 may extend corresponding to the shape of the boundary BD.

Each of the first signal line parts SLP1 may include a first connection part CEP1, and each of the second signal line parts SLP2 may include a second connection part CEP2. The first connection part CEP1 and the second connection part CEP2 may reduce amounts of charges accumulated on each of the first signal line parts SLP1 and second signal line parts SLP2. Thus, during an electrostatic discharge test, a peak current occurring in the first signal line parts SLP1 and second signal line parts SLP2 may be reduced. Therefore, the possibility of causing electrical damage to a display panel 210 (see FIG. 3) may be reduced.

Each of the first connection part CEP1 and the second connection part CEP2 may be provided in plurality. A portion of the first connection parts CEP1 may be disposed on the second region AR2 and the other portion may be disposed on the third region AR3. In addition, a portion of the second connection parts CEP2 may be disposed on the second region AR2, and the other portion may be disposed on the third region AR3. According to an exemplary embodiment, since a portion of the first connection parts CEP1 and a portion of the second connection parts CEP2 are disposed on the second region AR2, the area of a dead space around the module hole MH may be reduced. The dead space may include a portion of the second region AR2 and the third region AR3. For example, a portion of the third region AR3 may be a region in which a pixel PX is not disposed.

The pixel PX may be provided in plurality, and hereinafter referred to as pixels PX.

One pixel among the pixels PX may be electrically connected to one scan line GL and one data line DL. Another pixel PX among the pixels PX may be electrically connected to one scan line GL and one of the first signal line parts SLP1. Still another pixel PX among the pixels PX may be electrically connected to one data line DL and one of the second signal line parts SLP2. Yet another pixel PX among the pixels PX may be electrically connected to one of the first signal line parts SLP1 and one of the second signal line parts SLP2.

Figure 9:
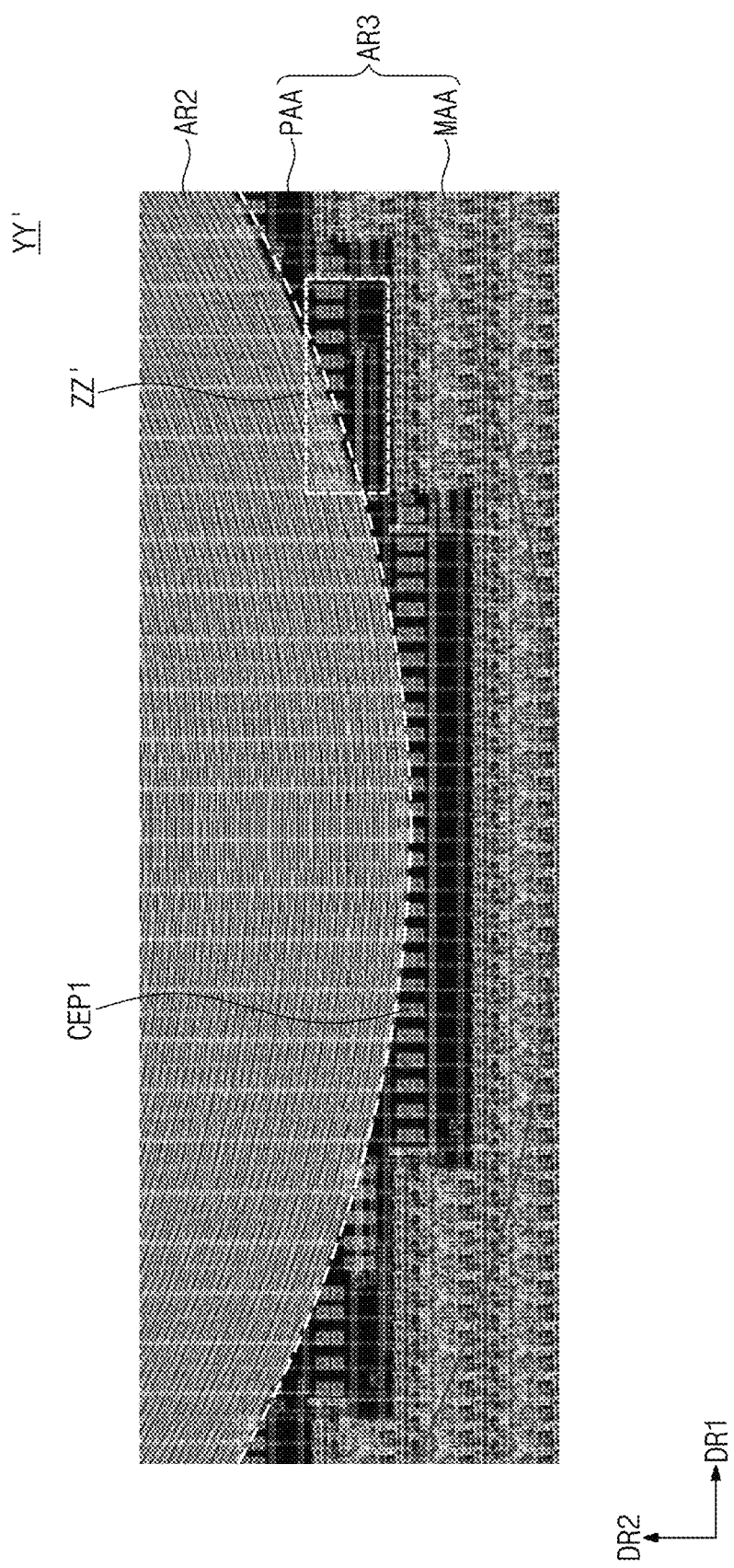
FIG. 9 is a view of a captured image of a region corresponding to region YY' shown in FIG. 8.

FIG. 9 is a view of a captured image of a region corresponding to region YY' shown in FIG. 8.

Referring to FIGS. 3 and 9, a third region AR3 may include a major region MAA and a peripheral region PAA. A Pixel PX may be disposed on the major region MAA, and a pixel PX may not disposed on the peripheral region PAA, and the first connection parts CEP1 and the second connection parts CEP2 (see FIG. 8) may be disposed on the peripheral region PAA. The peripheral region PAA and one region of a display panel 210 corresponding to a second region AR2 are regions in which no image is displayed and may be defined as a dead space.

According to an exemplary embodiment, since a portion of the first connection parts CEP1 and a portion of the second connection parts CEP2 are disposed on the second region AR2, the width of the peripheral region PAA may be reduced. Accordingly, the area of the dead space may be reduced.

Figure 10:
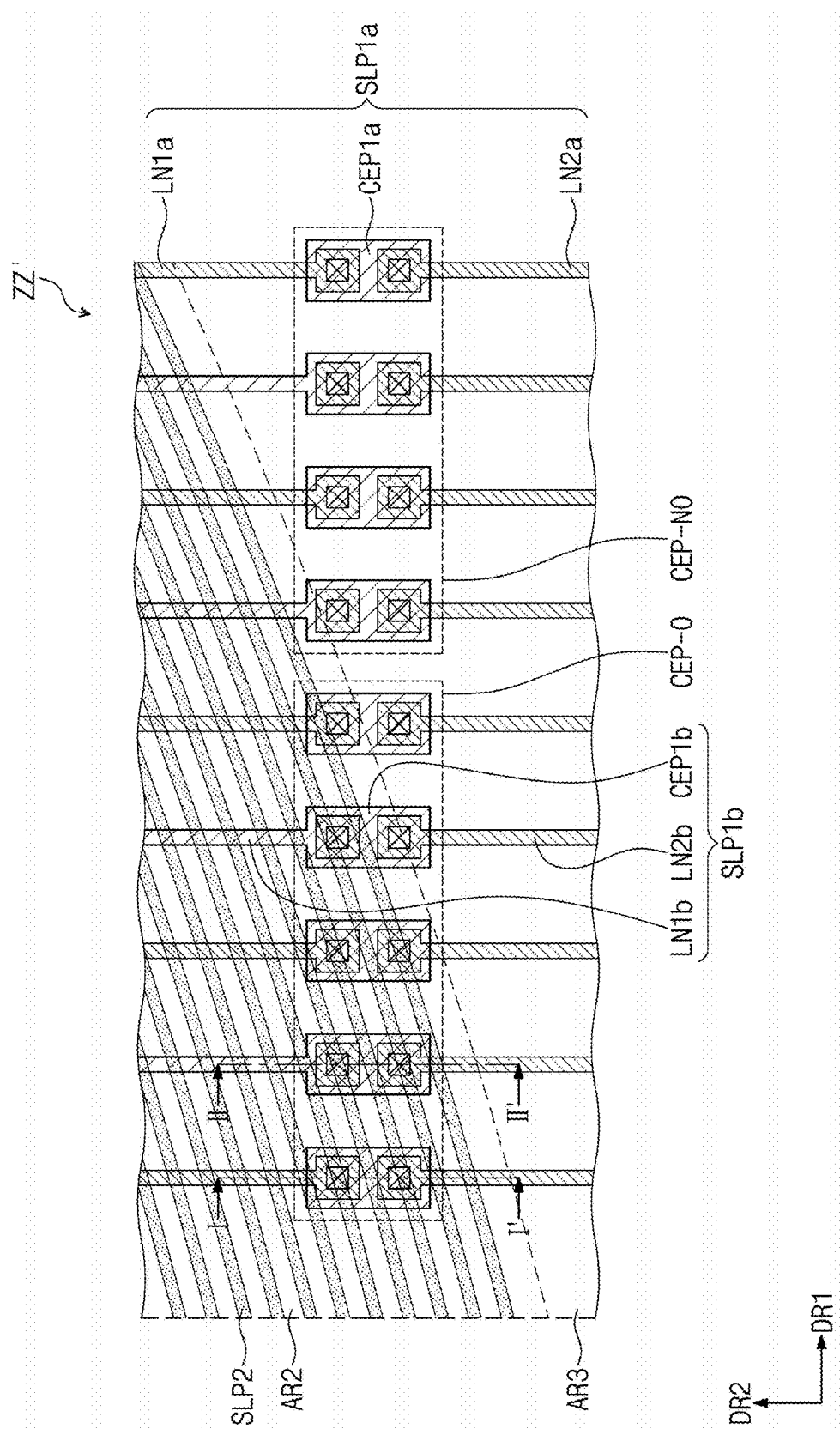
FIG. 10 is a schematic plan view of a region corresponding to region ZZ' shown in FIG. 9.
Figure 11:
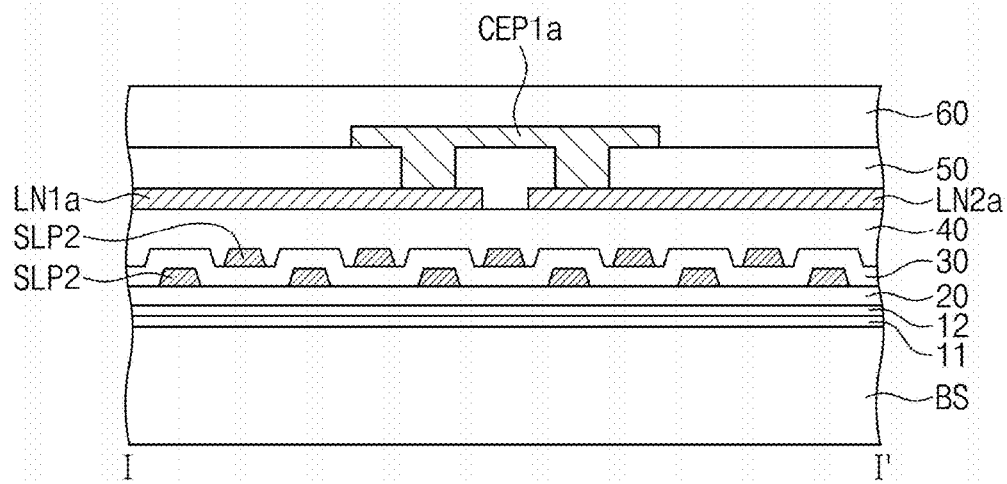
FIG. 11 is a cross-sectional view taken along a sectional line I-I' of FIG. 10.
Figure 12:
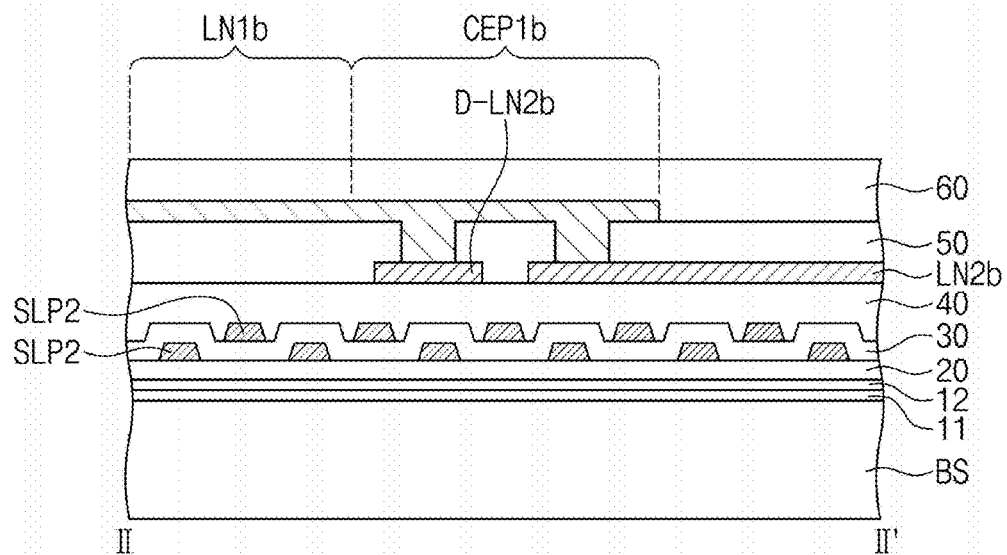
FIG. 12 is a cross-sectional view taken along a sectional line II-IF of FIG. 10.

FIG. 10 is a schematic plan view illustrating a region corresponding to region ZZ' of FIG. 9. FIG. 11 is a cross-sectional view taken along a sectional line I-I' of FIG. 10, and FIG. 12 is a cross-sectional view taken along a sectional line II-IF of FIG. 10. For convenience of description, some components are omitted in FIGS. 10, 11, and 12.

Referring to FIGS. 8, 9, 10, 11, and 12, the first signal line parts SLP1 may be divided into a first signal line part SLP1$a$ and a first signal line part SLP1$b$. Each of the first signal line part SLP1$a$ and the first signal line part SLP1$b$ may be provided in plurality, and the first signal line part SLP1$a$ and the first signal line part SLP1$b$ may be alternately arrayed in the first direction DR1.

The first signal line part SLP1$a$ may include a first line LN1$a$, a second line LN2$a$, and a first connection part CEP1a. The first line LN1$a$ and the second line LN2$a$ may be spaced apart from each other. The first line LN1$a$ and the second line LN2$a$ may not be directly connected to each other. The wording "not directly connected" may mean "not in direct contact with". The first line LN1$a$ and the second line LN2$a$ may be electrically connected to each other through the first connection part CEP1$a$.

FIG. 11 may correspond to the cross-sectional view of the first signal line part SLP1$a$. The first line LN1$a$ and the second line LN2$a$ may be disposed on the same layer as each other. For example, the first line LN1$a$ and the second line LN2$a$ may be disposed between the fourth insulating layer 40 and the fifth insulating layer 50. That is, the first line LN1$a$ and the second line LN2$a$ may constitute the third line SLc illustrated in FIG. 6.

The first connection part CEP1$a$ may be disposed on a fifth insulating layer 50. The first connection part CEP1$a$ may pass through the fifth insulating layer 50 and be connected to each of the first line LN1$a$ and the second line LN2$a$.

The first signal line part SLP1$b$ may include a first line LN1$b$, a second line LN2$b$, and a first connection part CEP1$b$. The first line LN1$b$ and the second line LN2$b$ may be spaced apart from each other and be disposed on layers different from each other. The first line LN1$b$ and the second line LN2$b$ may be electrically connected to each other through the first connection part CEP1$b$.

FIG. 12 may correspond to the cross-sectional view of the first signal line part SLP1$b$. The first line LN1$b$ may be disposed between the fifth insulating layer 50 and the sixth insulating layer 60, and the second line LN2$b$ may be disposed between the fourth insulating layer 40 and the fifth insulating layer 50. The first line LN1$b$ may constitute the fourth line SLd shown in FIG. 6, and the second line LN2$b$ may constitute the third line SLc shown in FIG. 6.

The first connection part CEP1$b$ may be disposed on the same layer as the first line LN1$b$, and may extend from the first line LN1$b$. In another exemplary embodiment, the first connection part CEP1$b$ may be disposed on the same layer as the second line LN2$b$, and may extend from the second line LN2$b$. The first signal line part SLP1$b$ may further include a dummy pattern D-LN2$b$. The dummy pattern D-LN2$b$ may be disposed on the same layer as the second line LN2$b$. The dummy pattern D-LN2$b$ may be electrically connected to the first connection part CEP1$b$. In addition, in another exemplary embodiment, the dummy pattern D-LN2$b$ may be omitted or also be connected to the second line LN2$b$.

Referring again to FIG. 10, the connection parts CEP1$a$ and CEP1$b$ may be disposed so as to be spaced apart from each other in the first direction DR1. At least three most adjacent first connection parts CEP1$a$ and CEP1$b$ among the first connection parts CEP1$a$ and CEP1$b$ may overlap each other in the first direction DR1.

In addition, a portion of the first connection parts CEP1$a$ and CEP1$b$ may be divided into overlapped connection part CEP-O and the other portion may be divided into non-overlapped connection part CEP-NO. At least a portion of the overlapped connection part CEP-O may overlap the second region AR2. The overlapped connection part CEP-O may overlap at least a portion of the second signal line parts SLP2. The non-overlapped connection part CEP-NO may not overlap the second region AR2. That is, the non-overlapped connection part CEP-NO may be disposed on the third region AR3.

Each of the overlapped connection part CEP-O and the non-overlapped connection part CEP-NO may be provided in plurality and each of the overlapped connection part CEP-O and the non-overlapped connection part CEP-NO may be arrayed so as to be spaced apart from each other in the first direction DR1.

Figure 13:
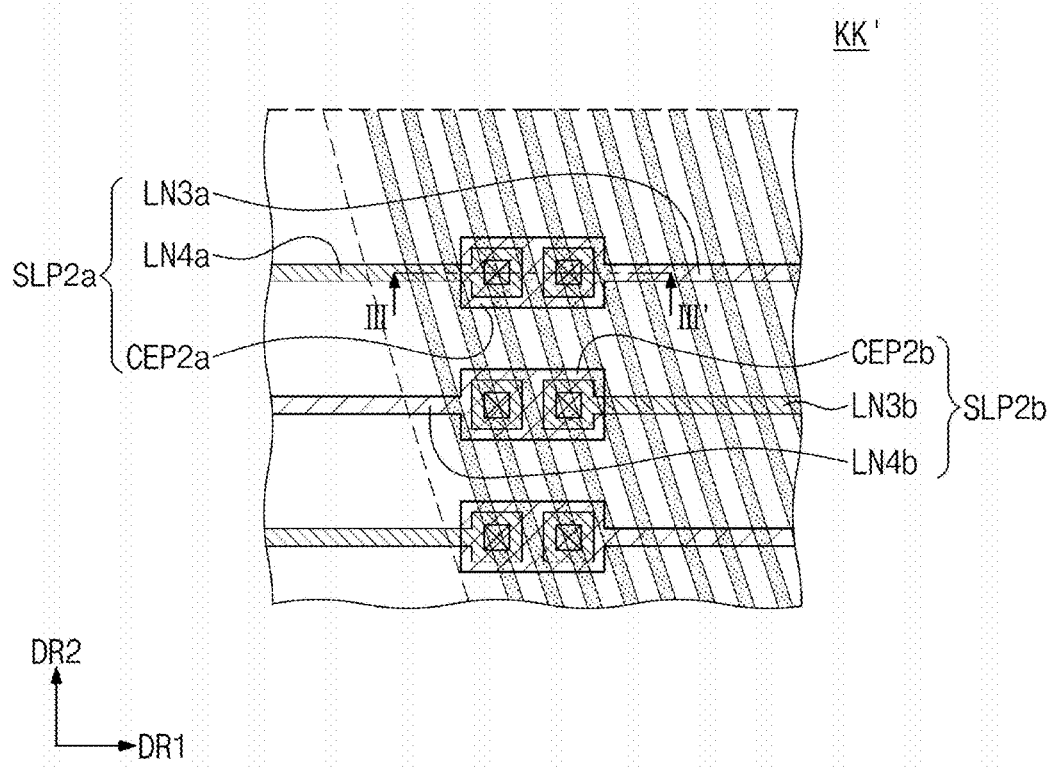
FIG. 13 is an enlarged schematic plan view of region KK' shown in FIG. 8.
Figure 14:
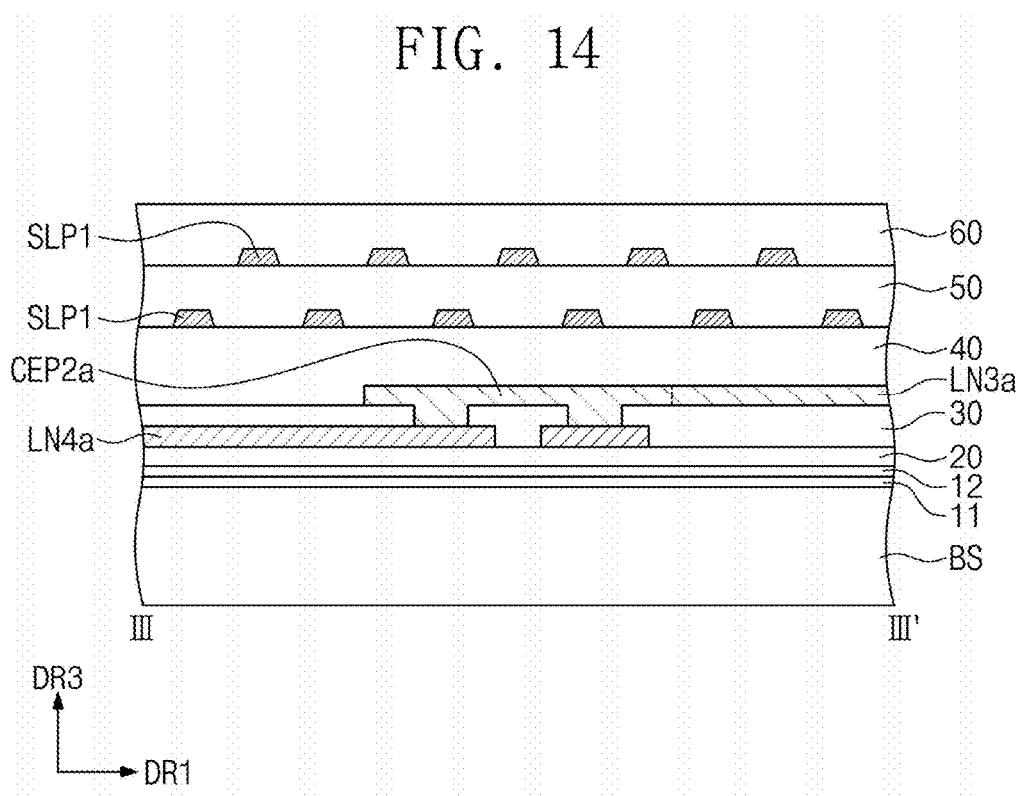
FIG. 14 is a cross-sectional view taken along a sectional line III-III' of FIG. 13.

FIG. 13 is an enlarged plan view illustrating region KK' shown in FIG. 8. FIG. 14 is a cross-sectional view taken along a sectional line of FIG. 13.

Referring to FIGS. 13 and 14, the second signal line parts SLP2 may be divided into a second signal line part SLP2$a$ and a second signal line part SLP2$b$. Each of the second signal line part SLP2$a$ and the second signal line part SLP2$b$ may be provided in plurality and may be arrayed so as to be alternately arrayed in the second direction DR2.

The second signal line part SLP2$a$ may include a third line LN3$a$, a fourth line LN4$a$, and a second connection part CEP2$a$. The third line LN3$a$ and the fourth line LN4$a$ may be spaced apart from each other. The third line LN3$a$ and the fourth line LN4$a$ may not be directly connected to each other. The second signal line part SLP2$b$ may include a third line LN3$b$, a fourth line LN4$b$, and a second connection part CEP2$b$. The third line LN3$b$ and the fourth line LN4$b$ may be spaced apart from each other. The third line LN3$b$ and the fourth line LN4$b$ may not be directly connected to each other.

The third line LN3$a$ may be disposed between the third insulating layer 30 and the fourth insulating layer 40, and may constitute the second line SLb described in FIG. 6. The fourth line LN4$a$ may be disposed between the second insulating layer 20 and the third insulating layer 30, and may constitute the first line SLa described in FIG. 6. The third line LN3b may constitute the first line SLa, and the fourth line LN4b may constitute the second line SLb. When viewed in a plan view, the second connection parts CEP2a and CEP2b may overlap the first signal line parts SLP1.

Figure 15:
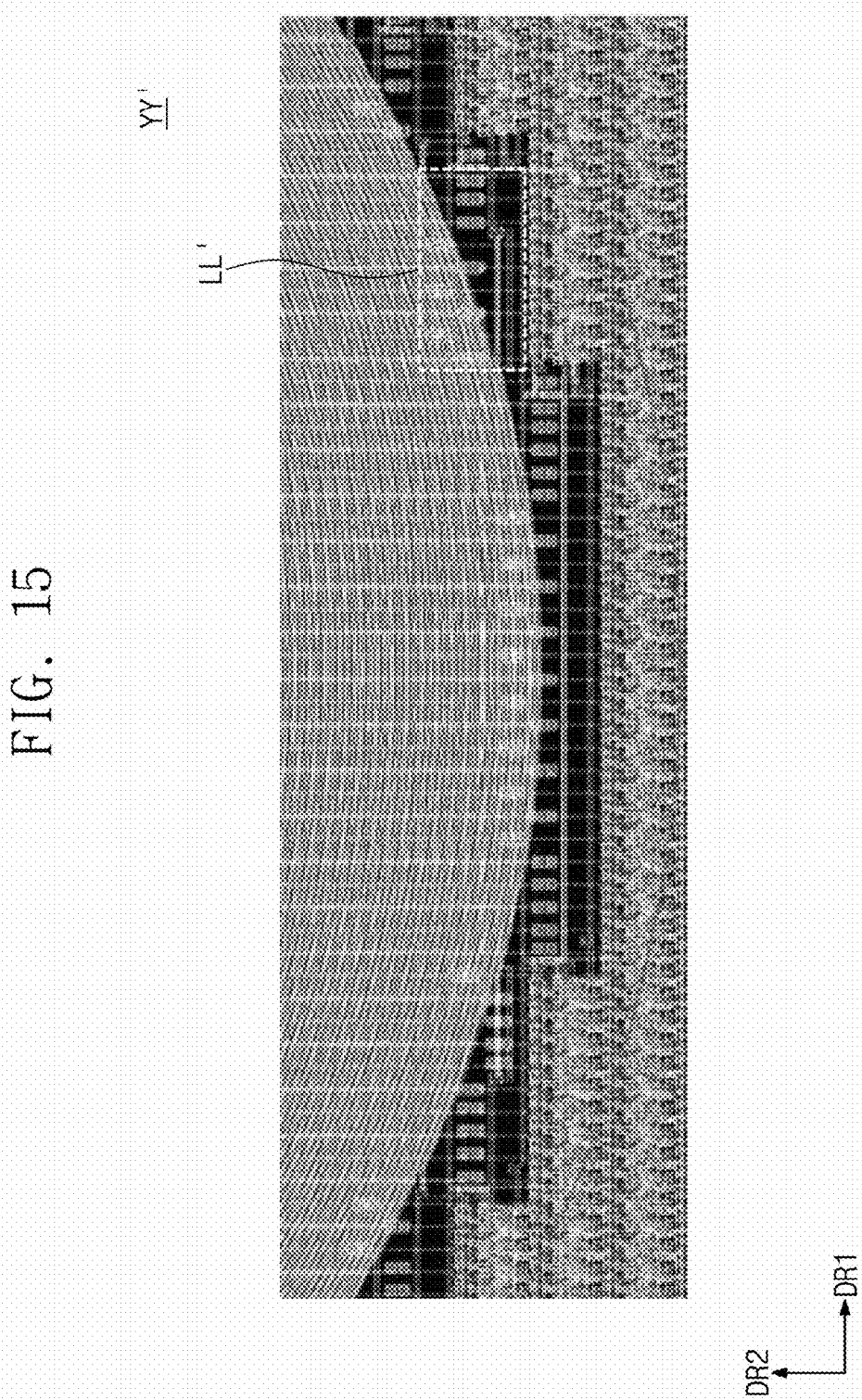
FIG. 15 is a view of a captured image of a region corresponding to the region YY' shown in FIG. 8.
Figure 16:
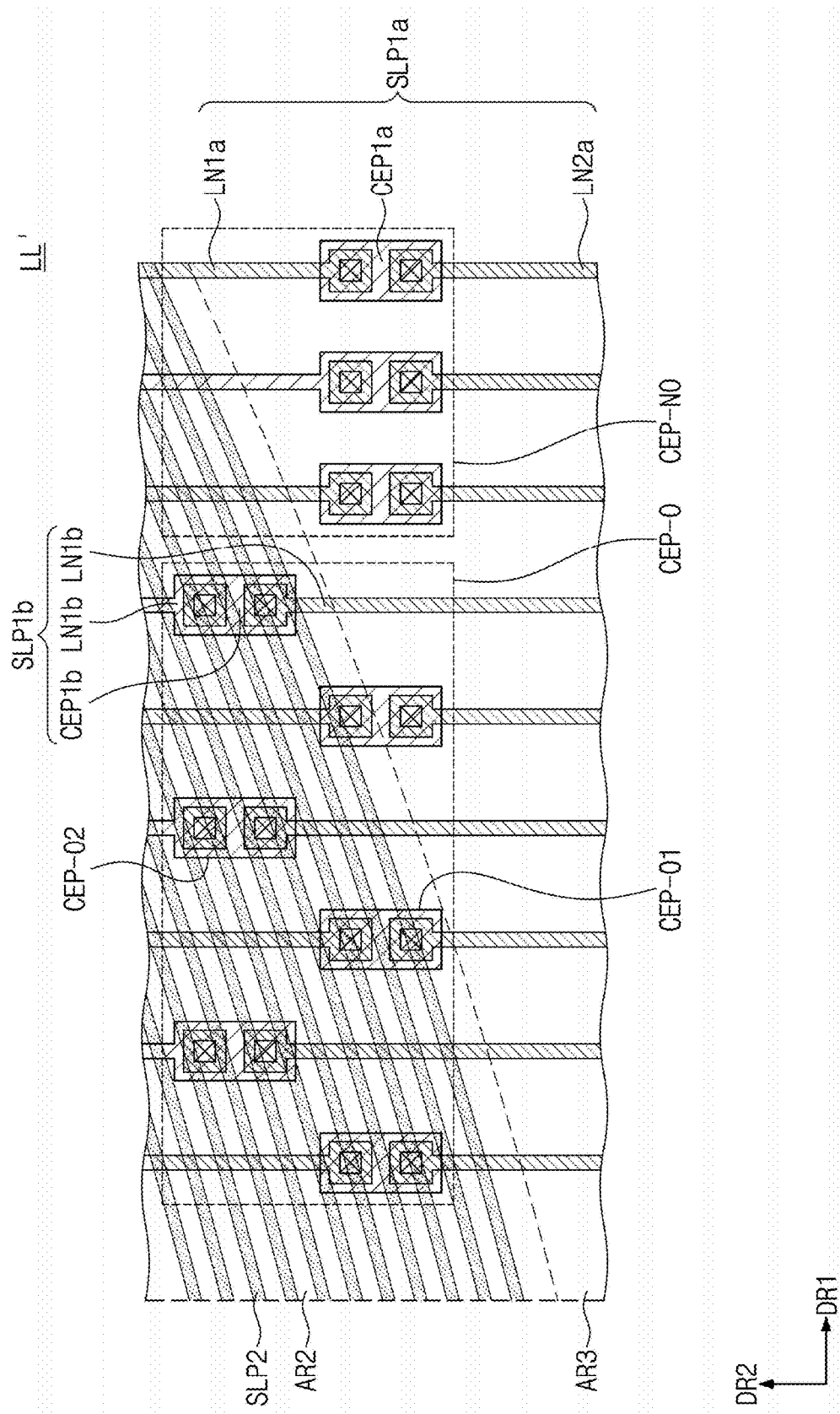
FIG. 16 is a schematic plan view of a region corresponding to region LL' shown in FIG. 15.

FIG. 15 is a view of a captured image of a region corresponding to the region YY' shown in FIG. 8. FIG. 16 is a schematic plan view illustrating a region corresponding to region LL' of FIG. 15.

Referring to FIGS. 15 and 16, a portion of the first connection parts CEP1a and CEP1b may be divided into overlapped connection part CEP-O and the other portion may be divided into non-overlapped connection part CEP-NO. The overlapped connection part CEP-O may overlap the second region AR2. The overlapped connection part CEP-O may overlap at least a portion of the second signal line parts SLP2. The non-overlapped connection part CEP-NO may not overlap the second region AR2. That is, the non-overlapped connection part CEP-NO may be disposed on the third region AR3.

Unevenness may be caused by the second signal line parts SLP2 on the surface on which the overlapped connection parts CEP-O is disposed. Residues may remain in the unevenness while the overlapped connection parts CEP-O are formed. The overlapped connection parts CEP-O adjacent to each other may be connected to each other by the residues, and this may cause an operational defect of the display panel 210.

According to an exemplary embodiment, each of the overlapped connection part CEP-O and the non-overlapped connection part CEP-NO may be provided in plurality. The non-overlapped connection parts CEP-NO may be arrayed while being spaced apart from each other in the first direction DR1. The overlapped connection parts CEP-O may be arrayed zigzag with respect to a virtual line extending in the first direction DR1. That is, the overlapped connection parts CEP-O may not be disposed continuously in a predetermined direction. For example, two adjacent overlapped connection parts CEP-O1 and CEP-O2 among the overlapped connection parts CEP-O may not overlap each other when viewed in the first direction DR1. Accordingly, the probability that the two overlapped connection parts CEP-O1 and CEP-O2 are connected to each other by the residues may be reduced.

For example, the widths of the overlapped connection parts CEP-O1 and CEP-O2 are larger than the width of the first lines LN1a and LN1b and the widths of the second lines LN2a and LN2b. The widths mean the widths in the first direction DR1. According to an exemplary embodiment, the overlapped connection parts CEP-O1 and CEP-O2 are not disposed continuously in the first direction DR1. Accordingly, the distance between the first signal line parts SLP1a and SLP1b adjacent to each other may be increased. Thus, the phenomenon, in which the first signal line parts SLP1a and SLP1b adjacent to each other are shorted with each other, may be prevented.

In an exemplary embodiment, at least a portion of each of the two adjacent overlapped connection parts CEP-O1 and CEP-O2 among the overlapped connection parts CEP-O may not overlap each other when viewed in the first direction DR1. That is, at least the other portion of the two adjacent overlapped connection parts CEP-O1 and CEP-O2 may overlap each other when viewed in the first direction DR1. In this case, since the centers of the overlapped connection parts CEP-O are not disposed on the same line, for example, in a line extending in the first direction DR1, the probability that the overlapped connection parts CEP-O are connected by residues may be reduced.

Figure 17:
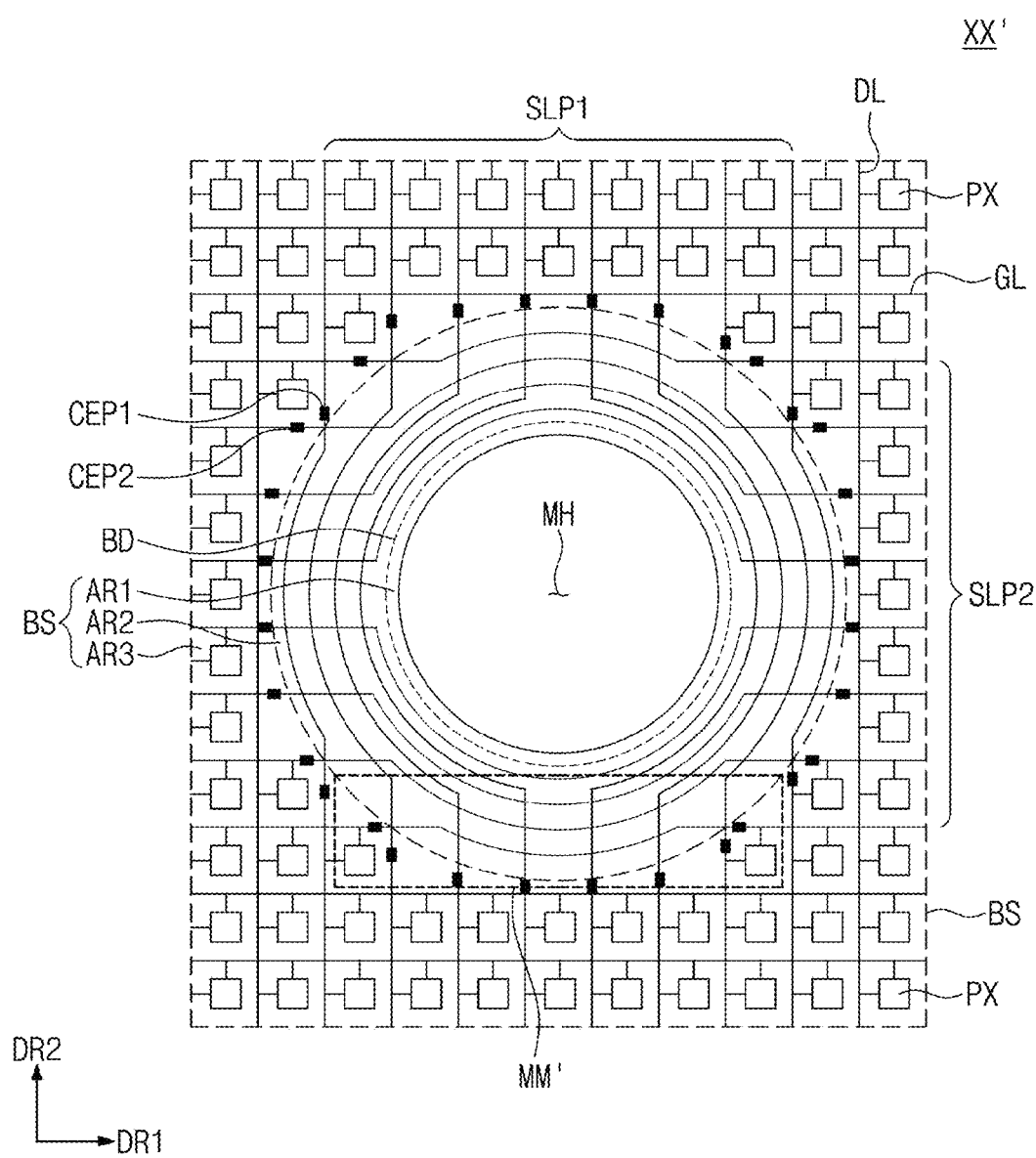
FIG. 17 is an enlarged plan view showing the region XX' shown in FIG. 3.
Figure 18:
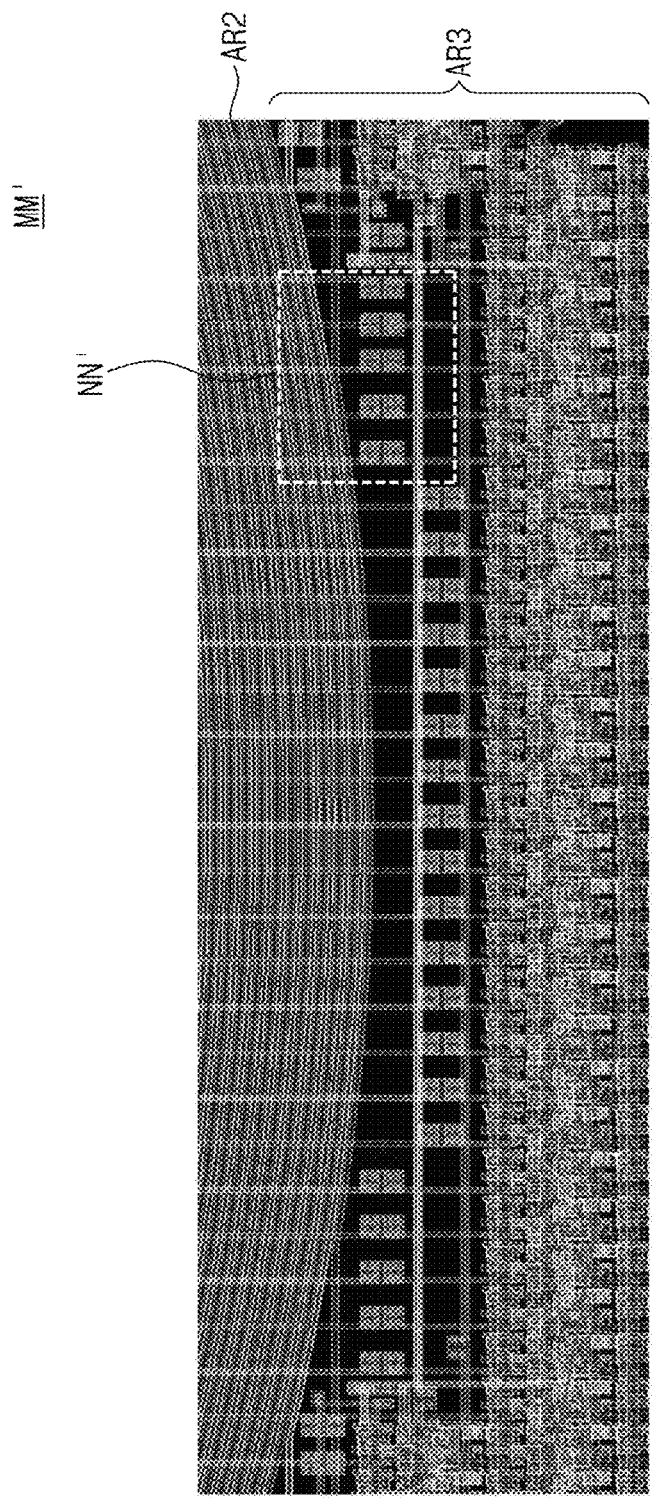
FIG. 18 is a view of a captured image of a region corresponding to region MM' shown in FIG. 17.
Figure 19:
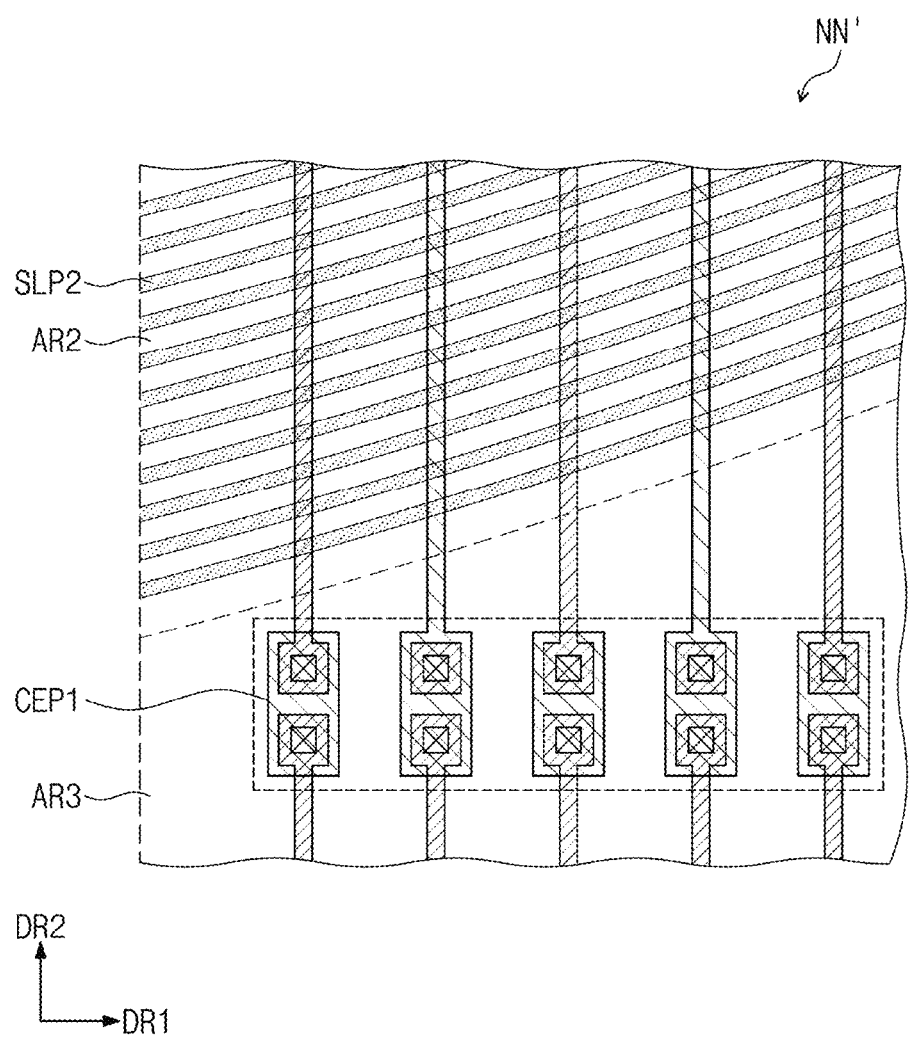
FIG. 19 is a schematic plan view of a region corresponding to region NN' shown in FIG. 18.

FIG. 17 is an enlarged plan view illustrating the region XX' shown in FIG. 3. FIG. 18 is a view in which a region corresponding to region MM' of FIG. 17 is imaged. FIG. 19 is a schematic plan view illustrating a region corresponding to region NN' of FIG. 18.

Referring to FIGS. 17, 18, and 19, when comparing with FIG. 8, the positions of the first connection parts CEP1 and the second connection parts CEP2 are different.

The first connection parts CEP1 may not overlap the second signal line parts SLP2, and the second connection parts CEP2 may not overlap the first signal line parts SLP1. For example, each of the first connection parts CEP1 and the second connection parts CEP2 may not be disposed on the second region AR2, but disposed on the third region AR3.

Figure 20:
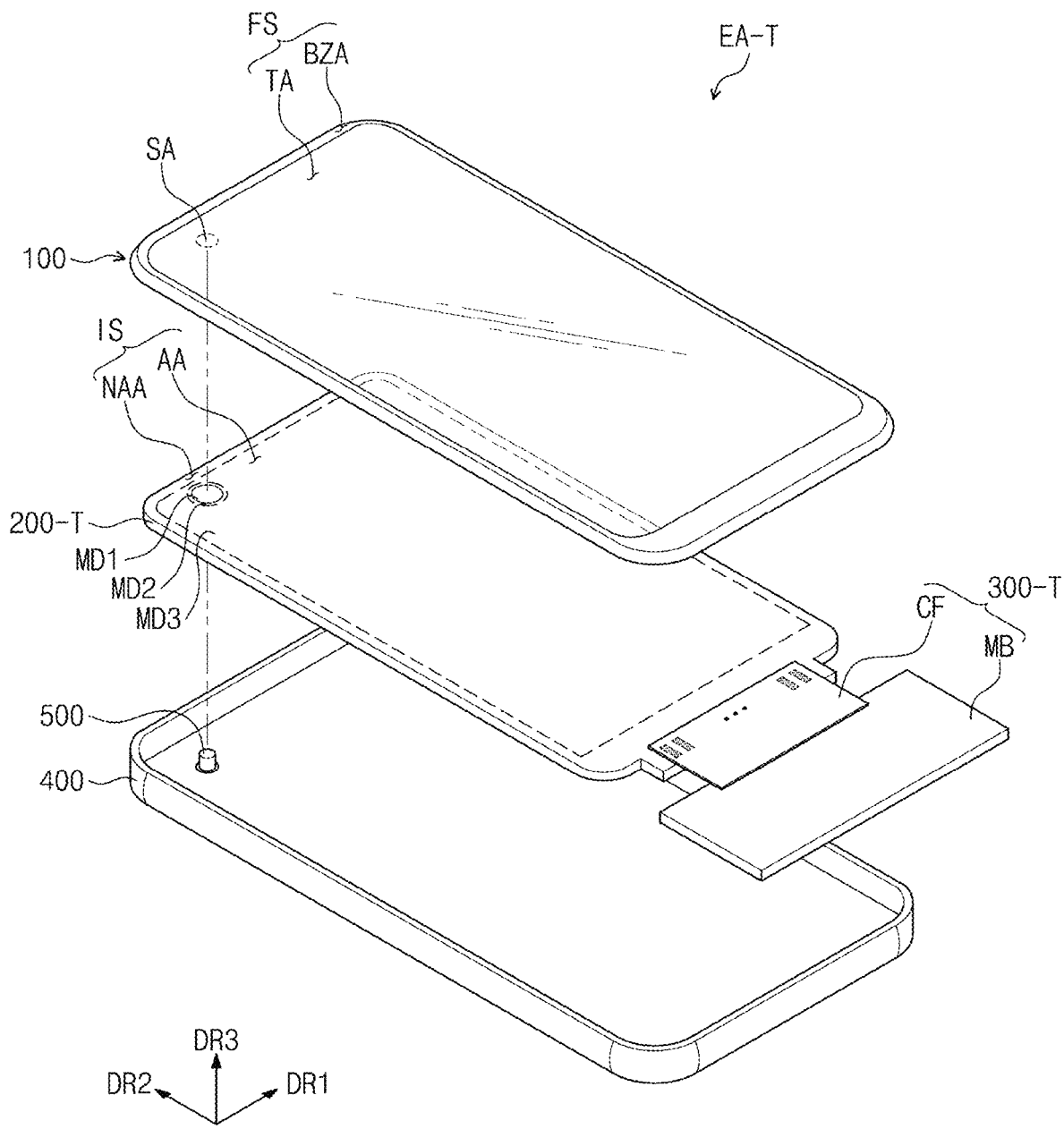
FIG. 20 is an exploded perspective view of a display device according to an exemplary embodiment.

FIG. 20 is an exploded perspective view of a display device according to an exemplary embodiment. In describing FIG. 20, portions having difference from FIG. 1B will be described, and the same components as the components described in FIG. 1B are referred to by the same reference symbols and the overlapping description will not be provided.

Referring to FIG. 20, a display device EA-T may include a window 100, a display module 200-T, a drive circuit part 300-T, a housing 400, and an electronic module 500.

The drive circuit part 300-T may include a main circuit board MB and a flexible film CF. The display module 200-T may be divided into a first module region MD1, a second module region MD2, and a third module region MD3. The first module region MD1 may be a region corresponding to the first region AR1 of the base layer BS shown in FIG. 3, the second module region MD2 may be a region corresponding to the second region AR2 of the base layer BS, and the third module region MD3 may be a region corresponding to the third region AR3 of the base layer BS.

The first module region MD1 may be a region overlapping the electronic module 500 when viewed in a plan view. The transmittance of the first module region MD1 may be higher than the transmittance of the third module region MD3. In order to raise the transmittance of the first module region MD1, predetermined components may not be disposed in the first module region MD1. For example, an avoidance design may be performed so that at least a portion of the signal lines GL, DL, and PL (see FIG. 3) may not overlap the first module region MD1. In addition, at least a portion of the components constituting the display module 200-T may not be disposed in the first module region MD1. For example, in the first module region MD1, at least one of the first electrode E1 (see FIG. 5), the second electrode E2 (see FIG. 5), the light-emitting element ELD (see FIG. 5), the transistor TR (see FIG. 5), the first sensing electrode TE1 (see FIG. 4), or the second sensing electrode TE2 (see FIG. 4) may not be disposed.

Thus, the electronic module 500 disposed to overlap the first module region MD1 may easily view an external subject through the first module region MD1, or an output signal generated by the electronic module 500 may easily be transmitted to the outside.

A display device according to an exemplary embodiment may include a base layer, first signal line parts, and second signal line parts. The base layer may include a first region in which the first signal line parts and the second signal line parts are not disposed, a second region surrounding the first region, and a third region surrounding the second region. The first signal line parts may include first connection parts. A portion of the first connection parts may overlap the second signal line parts disposed on the second region. Accordingly, the area of a dead space around the first region may be reduced. In addition, the first connection parts overlapping the second region may not be continuously disposed in a predetermined direction. Thus, the first signal line parts adjacent to each other may be prevented from being shorted with each other.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a base layer in which a hole is defined; and
lines comprise first-layer lines, second-layer lines, third-layer lines, and fourth-layer lines disposed on different layers, respectively,
wherein the first-layer lines and the second-layer lines are alternately arranged one by one, and the third-layer lines and the fourth-layer lines are alternately arranged one by one when viewed in a plan view.

2. The display device of claim 1, wherein one of the third-layer lines is disposed between one of the first-layer lines and one of the second-layer lines when viewed in a plan view, and one of the fourth-layer lines is disposed between another one of the first-layer lines and another one of the second-layer lines when viewed in a plan view.

3. The display device of claim 1, further comprising:
pixels disposed on the base layer;
scan lines electrically connected to at least some of the pixels and disposed on the base layer; and
data lines electrically connected to at least some of the pixels and disposed on the base layer,
wherein each of the scan lines is electrically connected to a corresponding one of the first and second-layer lines, and
wherein each of the data lines is electrically connected to a corresponding one of the third and fourth-layer lines.

4. The display device of claim 3, further comprising:
connection parts connecting the data lines and the third and fourth-layer lines.

5. The display device of claim 4, wherein at least some of the connection parts overlap the first-layer lines or the second-layer lines.

6. The display device of claim 4, wherein one third-layer line of the third-layer lines and one of the data lines electrically connected to the one third-layer line are disposed on a same layer, and
one of the connection parts is electrically connected to the one third-layer line and the one of the data lines is disposed on a layer different from the one third-layer line.

7. The display device of claim 4, wherein one fourth-layer line of the fourth-layer lines and one of the data lines electrically connected to the one fourth-layer line are disposed on different layers, and
one of the connection parts is electrically connected to the one fourth-layer line and the one of the data lines is disposed on a same layer as the one fourth-layer line or the one of the data lines.

8. The display device of claim 4,
wherein the connection parts comprise overlapped connection parts and non-overlapped connection parts, and
wherein the overlapped connection parts overlap at least some of the first and second-layer lines, and the non-overlapped connection parts do not overlap the first and second-layer lines.

9. The display device of claim 8, wherein the overlapped connection parts are arranged along a first direction, and the non-overlapped connection parts are arranged along the first direction.

10. The display device of claim 8, wherein the non-overlapped connection parts are 2 arranged along a first direction, and two adjacent overlapped connection parts among the overlapped connection parts do not overlap each other when viewed in the first direction.

11. The display device of claim 8, wherein the non-overlapped connection parts are arranged along a first direction,
one portion of each of two most adjacent overlapped connection parts to each other among the overlapped connection parts do not overlap each other when viewed in the first direction, and
a remaining portion of the two most adjacent overlapped connection parts to each other overlap each other in the first direction.

12. The display device of claim 1, wherein the lines extend corresponding to a shape of the hole.

13. A display device comprising:
a base layer in which a hole is defined;
lines disposed on the base layer; and
cross lines disposed on the base layer, and intersecting the lines,
wherein the lines comprise first line portions, second line portions disposed on a layer different from the first line portions, third line portions, and connection portions,
wherein the cross lines comprise fourth line portions, and fifth line portions disposed on a layer different from the fourth line portions, and
wherein in a direction away from the base layer, the fourth line portions, the fifth line portions, the first line portions, and the second line portions are sequentially arranged.

14. The display device of claim 13, wherein the third line portions are arranged on a same layer, and the third line portions are arranged on the same layer as the first line portions or the second line portions.

15. The display device of claim 13, wherein at least some of the connection portions overlap at least some of the fourth line portions and the fifth line portions.

16. The display device of claim 13, wherein the connection portions comprise overlapped connection parts and non-overlapped connection parts, and
wherein the overlapped connection parts overlap at least some of the fourth line portions and the fifth line portions, and the non-overlapped connection parts do not overlap the fourth line portions and the fifth line portions.

17. The display device of claim 13, wherein each of the first line portions, second line portions, the fourth line portions, and the fifth line portions extends corresponding to a shape of the hole.

18. The display device of claim 13, wherein the cross lines further comprise sixth line portions,
the third line portions extend along a first direction and are spaced apart from each other in a second direction crossing the first direction, and
the sixth line portions extend along the second direction and are spaced apart from each other in the first direction.

19. An electronic device comprising a display device comprising:
- a base layer in which a hole is defined; and
- lines comprise first-layer lines, second-layer lines, third-layer lines, and fourth-layer lines disposed on different layers, respectively,
- wherein one of the third-layer lines is disposed between one of the first-layer lines and one of the second-layer lines when viewed in a plan view, and one of the fourth-layer lines is disposed between another one of the first-layer lines and another one of the second-layer lines when viewed in a plan view.

20. The electronic device of claim 19, wherein in a direction away from the base layer, the first-layer lines, the second-layer lines, the third-layer lines, and the fourth-layer lines are sequentially arranged.

* * * * *